US009009576B1

(12) United States Patent
Jeon et al.

(10) Patent No.: US 9,009,576 B1
(45) Date of Patent: Apr. 14, 2015

(54) ADAPTIVE LLR BASED ON SYNDROME WEIGHT

(71) Applicants: Seungjune Jeon, Milpitas, CA (US); Ying Tai, Mountain View, CA (US); Jiangli Zhu, Sunnyvale, CA (US); Xiaoheng Chen, San Jose, CA (US)

(72) Inventors: Seungjune Jeon, Milpitas, CA (US); Ying Tai, Mountain View, CA (US); Jiangli Zhu, Sunnyvale, CA (US); Xiaoheng Chen, San Jose, CA (US)

(73) Assignee: SanDisk Enterprise IP LLC, Milpitas, CA (US)

( * ) Notice: Subject to any disclaimer, the term of this patent is extended or adjusted under 35 U.S.C. 154(b) by 210 days.

(21) Appl. No.: 13/831,713

(22) Filed: Mar. 15, 2013

(51) Int. Cl.
| | |
|---|---|
| H03M 13/00 | (2006.01) |
| G11C 29/00 | (2006.01) |
| G06F 11/10 | (2006.01) |
| H03M 13/11 | (2006.01) |
| H03M 13/45 | (2006.01) |

(52) U.S. Cl.
CPC ....... *G06F 11/1068* (2013.01); *H03M 13/1111* (2013.01); *H03M 13/1108* (2013.01); *H03M 13/45* (2013.01)

(58) Field of Classification Search
CPC ............... H03M 13/1111; H03M 13/3707; H03M 13/1108; H03M 13/45; H03M 13/4138; H03M 13/3784; H04L 1/0047
USPC ............ 714/780, 785, 773, 758, 799, 817, 714/751–752, 755
See application file for complete search history.

(56) References Cited

U.S. PATENT DOCUMENTS

| | | | |
|---|---|---|---|
| 4,916,652 A | 4/1990 | Schwarz et al. | |
| 5,519,847 A | 5/1996 | Fandrich et al. | |
| 5,530,705 A | 6/1996 | Malone, Sr. | |
| 5,537,555 A | 7/1996 | Landry et al. | |
| 5,551,003 A | 8/1996 | Mattson et al. | |
| 5,657,332 A | 8/1997 | Auclair et al. | |

(Continued)

FOREIGN PATENT DOCUMENTS

| | | |
|---|---|---|
| EP | 1465203 A1 | 10/2004 |
| JP | 2002-532806 S | 10/2002 |

(Continued)

OTHER PUBLICATIONS

International Search Report and Written Opinion dated Mar. 7, 2014, received in International Patent Application No. PCT/US2013/074772, which corresponds to U.S. Appl. No. 13/831,218, 10 pages (George).

(Continued)

*Primary Examiner* — Christine Tu
(74) *Attorney, Agent, or Firm* — Morgan, Lewis & Bockius LLP

(57) ABSTRACT

Systems, methods and/or devices that enhance the reliability with which data can be stored in and read from a memory utilize an error indicator to adaptively determine the soft information values used for decoding. For example, in some implementations, the method includes selecting a first set of one or more soft information values and receiving a read data command. The method further includes responding to the read data command by initiating performance of a data access operation to access data in a storage medium, the data access operation producing a syndrome weight; determining a first indicator based at least in part on the syndrome weight; based on the first indicator, selecting a second set of one or more soft information values; and decoding data obtained from the data access operation using the second set of one or more soft information values to produce a result.

23 Claims, 9 Drawing Sheets

(56) References Cited

U.S. PATENT DOCUMENTS

| | | |
|---|---|---|
| 5,666,114 A | 9/1997 | Brodie et al. |
| 5,708,849 A | 1/1998 | Coke et al. |
| 5,936,972 A * | 8/1999 | Meidan et al. ............... 714/712 |
| 5,943,692 A | 8/1999 | Marberg et al. |
| 5,982,664 A | 11/1999 | Watanabe |
| 6,000,006 A | 12/1999 | Bruce et al. |
| 6,016,560 A | 1/2000 | Wada et al. |
| 6,018,304 A | 1/2000 | Bessios |
| 6,070,074 A | 5/2000 | Perahia et al. |
| 6,138,261 A | 10/2000 | Wilcoxson et al. |
| 6,145,110 A * | 11/2000 | Khayrallah ................. 714/752 |
| 6,182,264 B1 | 1/2001 | Ott |
| 6,192,092 B1 | 2/2001 | Dizon et al. |
| 6,295,592 B1 | 9/2001 | Jeddeloh |
| 6,311,263 B1 | 10/2001 | Barlow et al. |
| 6,442,076 B1 | 8/2002 | Roohparvar |
| 6,449,625 B1 | 9/2002 | Wang |
| 6,484,224 B1 | 11/2002 | Robins et al. |
| 6,516,437 B1 | 2/2003 | Van Stralen et al. |
| 6,678,788 B1 | 1/2004 | O'Connell |
| 6,757,768 B1 | 6/2004 | Potter et al. |
| 6,775,792 B2 | 8/2004 | Ulrich et al. |
| 6,810,440 B2 | 10/2004 | Micalizzi, Jr. et al. |
| 6,836,808 B2 | 12/2004 | Bunce et al. |
| 6,836,815 B1 | 12/2004 | Purcell et al. |
| 6,842,436 B2 | 1/2005 | Moeller |
| 6,871,257 B2 | 3/2005 | Conley et al. |
| 6,895,464 B2 | 5/2005 | Chow et al. |
| 6,978,343 B1 | 12/2005 | Ichiriu |
| 6,980,985 B1 | 12/2005 | Amer-Yahia et al. |
| 6,981,205 B2 | 12/2005 | Fukushima et al. |
| 6,988,171 B2 | 1/2006 | Beardsley et al. |
| 7,020,017 B2 | 3/2006 | Chen et al. |
| 7,032,123 B2 | 4/2006 | Kane et al. |
| 7,043,505 B1 | 5/2006 | Teague et al. |
| 7,100,002 B2 | 8/2006 | Shrader |
| 7,111,293 B1 | 9/2006 | Hersh et al. |
| 7,162,678 B2 | 1/2007 | Saliba |
| 7,173,852 B2 | 2/2007 | Gorobets et al. |
| 7,184,446 B2 | 2/2007 | Rashid et al. |
| 7,328,377 B1 | 2/2008 | Lewis et al. |
| 7,516,292 B2 | 4/2009 | Kimura et al. |
| 7,523,157 B2 | 4/2009 | Aguilar, Jr. et al. |
| 7,527,466 B2 | 5/2009 | Simmons |
| 7,529,466 B2 | 5/2009 | Takahashi |
| 7,571,277 B2 | 8/2009 | Mizushima |
| 7,574,554 B2 | 8/2009 | Tanaka et al. |
| 7,596,643 B2 | 9/2009 | Merry, Jr. et al. |
| 7,681,106 B2 | 3/2010 | Jarrar et al. |
| 7,685,494 B1 | 3/2010 | Varnica et al. |
| 7,707,481 B2 | 4/2010 | Kirschner et al. |
| 7,761,655 B2 | 7/2010 | Mizushima et al. |
| 7,774,390 B2 | 8/2010 | Shin |
| 7,840,762 B2 | 11/2010 | Oh et al. |
| 7,870,326 B2 | 1/2011 | Shin et al. |
| 7,890,818 B2 | 2/2011 | Kong et al. |
| 7,913,022 B1 | 3/2011 | Baxter |
| 7,925,960 B2 | 4/2011 | Ho et al. |
| 7,934,052 B2 | 4/2011 | Prins et al. |
| 7,954,041 B2 | 5/2011 | Hong et al. |
| 7,971,112 B2 | 6/2011 | Murata |
| 7,974,368 B2 | 7/2011 | Shieh et al. |
| 7,978,516 B2 | 7/2011 | Olbrich et al. |
| 7,996,642 B1 | 8/2011 | Smith |
| 8,006,161 B2 | 8/2011 | Lestable et al. |
| 8,032,724 B1 | 10/2011 | Smith |
| 8,069,390 B2 | 11/2011 | Lin |
| 8,190,967 B2 | 5/2012 | Hong et al. |
| 8,254,181 B2 | 8/2012 | Hwang et al. |
| 8,312,349 B2 | 11/2012 | Reche et al. |
| 8,347,195 B1 * | 1/2013 | Varnica et al. ............... 714/785 |
| 8,412,985 B1 | 4/2013 | Bowers et al. |
| 2002/0024846 A1 | 2/2002 | Kawahara et al. |
| 2002/0083299 A1 | 6/2002 | Van Huben et al. |
| 2002/0152305 A1 | 10/2002 | Jackson et al. |
| 2002/0162075 A1 | 10/2002 | Talagala et al. |
| 2002/0165896 A1 | 11/2002 | Kim |
| 2003/0041299 A1 | 2/2003 | Kanazawa et al. |
| 2003/0043829 A1 | 3/2003 | Rashid et al. |
| 2003/0088805 A1 | 5/2003 | Majni et al. |
| 2003/0093628 A1 | 5/2003 | Matter et al. |
| 2003/0188045 A1 | 10/2003 | Jacobson |
| 2003/0189856 A1 | 10/2003 | Cho et al. |
| 2003/0198100 A1 | 10/2003 | Matsushita et al. |
| 2003/0212719 A1 | 11/2003 | Yasuda et al. |
| 2004/0024957 A1 | 2/2004 | Lin et al. |
| 2004/0024963 A1 | 2/2004 | Talagala et al. |
| 2004/0073829 A1 | 4/2004 | Olarig |
| 2004/0153902 A1 | 8/2004 | Machado et al. |
| 2004/0181734 A1 | 9/2004 | Saliba |
| 2004/0199714 A1 | 10/2004 | Estakhri et al. |
| 2004/0237018 A1 | 11/2004 | Riley |
| 2005/0060456 A1 | 3/2005 | Shrader et al. |
| 2005/0060501 A1 | 3/2005 | Shrader |
| 2005/0114587 A1 | 5/2005 | Chou et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0039196 A1 | 2/2006 | Gorobets et al. |
| 2006/0053246 A1 | 3/2006 | Lee |
| 2006/0085671 A1 | 4/2006 | Majni et al. |
| 2006/0136570 A1 | 6/2006 | Pandya |
| 2006/0156177 A1 | 7/2006 | Kottapalli et al. |
| 2006/0195650 A1 | 8/2006 | Su et al. |
| 2006/0259528 A1 | 11/2006 | Dussud et al. |
| 2007/0011413 A1 | 1/2007 | Nonaka et al. |
| 2007/0058446 A1 | 3/2007 | Hwang et al. |
| 2007/0061597 A1 | 3/2007 | Holtzman et al. |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0113019 A1 | 5/2007 | Beukema et al. |
| 2007/0133312 A1 | 6/2007 | Roohparvar |
| 2007/0147113 A1 | 6/2007 | Mokhlesi et al. |
| 2007/0150790 A1 | 6/2007 | Gross et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0208901 A1 | 9/2007 | Purcell et al. |
| 2007/0234143 A1 | 10/2007 | Kim |
| 2007/0245061 A1 | 10/2007 | Harriman |
| 2007/0277036 A1 | 11/2007 | Chamberlain et al. |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019182 A1 | 1/2008 | Yanagidaira et al. |
| 2008/0022163 A1 | 1/2008 | Tanaka et al. |
| 2008/0052446 A1 | 2/2008 | Lasser et al. |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0115041 A1 * | 5/2008 | Park et al. ................. 714/785 |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2009/0003058 A1 | 1/2009 | Kang |
| 2009/0037652 A1 | 2/2009 | Yu et al. |
| 2009/0144598 A1 | 6/2009 | Yoon et al. |

(56) References Cited

U.S. PATENT DOCUMENTS

| | | | |
|---|---|---|---|
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0193058 A1 | 7/2009 | Reid |
| 2009/0207660 A1 | 8/2009 | Hwang et al. |
| 2009/0222708 A1 | 9/2009 | Yamaga |
| 2009/0296466 A1 | 12/2009 | Kim et al. |
| 2009/0296486 A1 | 12/2009 | Kim et al. |
| 2009/0319864 A1 | 12/2009 | Shrader |
| 2010/0061151 A1 | 3/2010 | Miwa et al. |
| 2010/0103737 A1 | 4/2010 | Park |
| 2010/0161936 A1 | 6/2010 | Royer et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0262889 A1 | 10/2010 | Bains |
| 2010/0281207 A1 | 11/2010 | Miller et al. |
| 2010/0281342 A1 | 11/2010 | Chang et al. |
| 2011/0083060 A1 | 4/2011 | Sakurada et al. |
| 2011/0113281 A1 | 5/2011 | Zhang et al. |
| 2011/0131444 A1 | 6/2011 | Buch et al. |
| 2011/0173378 A1 | 7/2011 | Filor et al. |
| 2011/0205823 A1 | 8/2011 | Hemink et al. |
| 2011/0213920 A1 | 9/2011 | Frost et al. |
| 2011/0228601 A1 | 9/2011 | Olbrich et al. |
| 2011/0231600 A1 | 9/2011 | Tanaka et al. |
| 2012/0096217 A1 | 4/2012 | Son et al. |
| 2012/0110250 A1 | 5/2012 | Sabbag et al. |
| 2012/0151253 A1 | 6/2012 | Horn |
| 2012/0195126 A1 | 8/2012 | Roohparvar |
| 2012/0239976 A1 | 9/2012 | Cometti et al. |
| 2012/0284587 A1 | 11/2012 | Yu et al. |

FOREIGN PATENT DOCUMENTS

| | | |
|---|---|---|
| WO | WO 2007/036834 A2 | 4/2007 |
| WO | WO 2007/080586 A2 | 7/2007 |
| WO | WO 2008/121553 | 10/2008 |
| WO | WO 2008/121577 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |

OTHER PUBLICATIONS

International Search Report and Written Opinion dated Mar. 24, 2014, received in International Patent Application No. PCT/US2013/074777, which corresponds to U.S. Appl. No. 13/831,308, 10 pages (George).
International Search Report and Written Opinion dated Mar. 7, 2014, received in International Patent Application No. PCT/US2013/074779, which corresponds to U.S. Appl. No. 13/831,374, 8 pages (George).
Canim, Buffered Bloom Filters on Solid State Storage, ADMS 10, Singapore, Sep. 13-17, 2010, 8 pgs.
Lu, A Forest-structured Bloom Filter with Flash Memory, MSST 2011, Denver, CO, May 23-27, 2011, article, 6 pgs.
Lu, A Forest-structured Bloom Filter with Flash Memory, MSST 2011, Denver, CO, May 23-27, 2011, presentation slides, 25 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
Barr, Introduction to Watchdog Timers, Oct. 2001, 3 pgs.
Kang, A Multi-Channel Architecture for High-Performance NAND Flash-Based Storage System, J. Syst. Archit., 53, 9, Sep. 2007, 15 pgs.
Kim, A Space-Efficient Flash Translation Layer for CompactFlash Systems, May 2002, 10 pgs.
McLean, Information Technology—AT Attachment with Packet Interface Extension, Aug. 19, 1998, 339 pgs.
Park, A High Performance Controller for NAND Flash-Based Solid State Disk (NSSD), Feb. 12-16, 2006, 4 pgs.
Pliant Technology, International Search Report / Written Opinion, PCT/US08/88133, Mar. 19, 2009, 7 pgs.
Pliant Technology, International Search Report / Written Opinion, PCT/US08/88136, Mar. 19, 2009, 7 pgs.
Pliant Technology, International Search Report / Written Opinion, PCT/US08/88146, Feb. 26, 2009, 10 pgs.
Pliant Technology, International Search Report / Written Opinion, PCT/US08/88154, Feb. 27, 2009, 9 pgs.
Pliant Technology, Written Opinion, PCT/US08/88164, Feb. 13, 2009, 6 pgs.
Pliant Technology, International Search Report / Written Opinion, PCT/US08/88206, Feb. 18, 2009, 8 pgs.
Pliant Technology, International Search Report / Written Opinion, PCT/US08/88217, Feb. 19, 2009, 7 pgs.
Pliant Technology, International Search Report / Written Opinion, PCT/US08/88229, Feb. 13, 2009, 8 pgs.
Pliant Technology, International Search Report / Written Opinion, PCT/US08/88232, Feb. 19, 2009, 8 pgs.
Pliant Technology, International Search Report / Written Opinion, PCT/US08/88236, Feb. 19, 2009, 7 pgs.
Pliant Technology, International Search Report / Written Opinion, PCT/US2011/028637, Oct. 27, 2011, 11 pgs.
Pliant Technology, Supplementary ESR, 08866997.3, Feb. 23, 2012, 6 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042775, Sep. 26, 2012, 9 pgs.
SanDisk Enterprise IP LLC, International Search Report / Written Opinion, PCT/US2012/059459, Feb. 14, 2013, 9 pgs.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005.
Zeidman, 1999 Verilog Designer's Library, 9 pgs.

\* cited by examiner

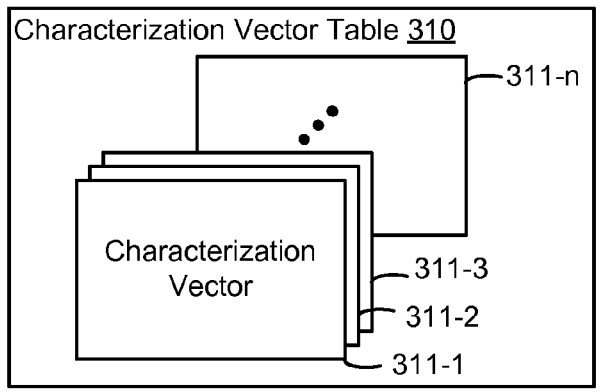
Figure 3A
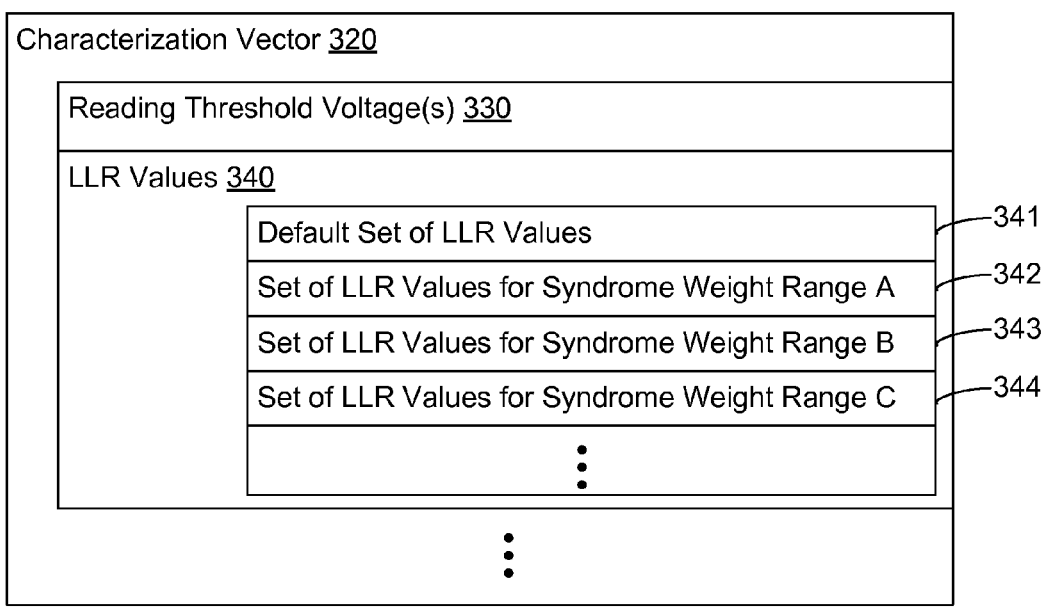
Figure 3B
Figure 3C

ADAPTIVE LLR BASED ON SYNDROME WEIGHT

TECHNICAL FIELD

The disclosed embodiments relate generally to memory systems, and in particular, to improving the error correction capability when using soft information error control decoding.

BACKGROUND

Semiconductor memory devices, including flash memory, typically utilize memory cells to store data as an electrical value, such as an electrical charge or voltage. A flash memory cell, for example, includes a single transistor with a floating gate that is used to store a charge representative of a data value. Increases in storage density have been facilitated in various ways, including increasing the density of memory cells on a chip enabled by manufacturing developments, and transitioning from single-level flash memory cells to multi-level flash memory cells, so that two or more bits can be stored by each flash memory cell.

A drawback of increasing storage density is that the stored data is increasingly prone to being stored and/or read erroneously. An error control coding (ECC) engine is utilized to limit the number of uncorrectable errors that are introduced by electrical fluctuations, defects in the storage medium, operating conditions, device history, and/or write-read circuitry, etc.

SUMMARY

Various implementations of systems, methods and devices within the scope of the appended claims each have several aspects, no single one of which is solely responsible for the attributes described herein. Without limiting the scope of the appended claims, after considering this disclosure, and particularly after considering the section entitled "Detailed Description" one will understand how the aspects of various implementations are used to enable decoding data read from a storage medium in a manner that improves the error correction capability when using soft information error control decoding. In one aspect, an error indicator is used to adaptively determine the soft information values used for decoding.

BRIEF DESCRIPTION OF THE DRAWINGS

So that the present disclosure can be understood in greater detail, a more particular description may be had by reference to the features of various implementations, some of which are illustrated in the appended drawings. The appended drawings, however, merely illustrate the more pertinent features of the present disclosure and are therefore not to be considered limiting, for the description may admit to other effective features.

FIG. 3A is a transition probability table associated with either a single-level memory cell or a single-page read of a multi-level memory cell, in accordance with some embodiments.

FIG. 3B is a block diagram illustrating an implementation of a characterization vector table, in accordance with some embodiments.

FIG. 3C is a schematic diagram of an implementation of a characterization vector produced from the transition probability table of FIG. 3A, in accordance with some embodiments.

Figure 1:
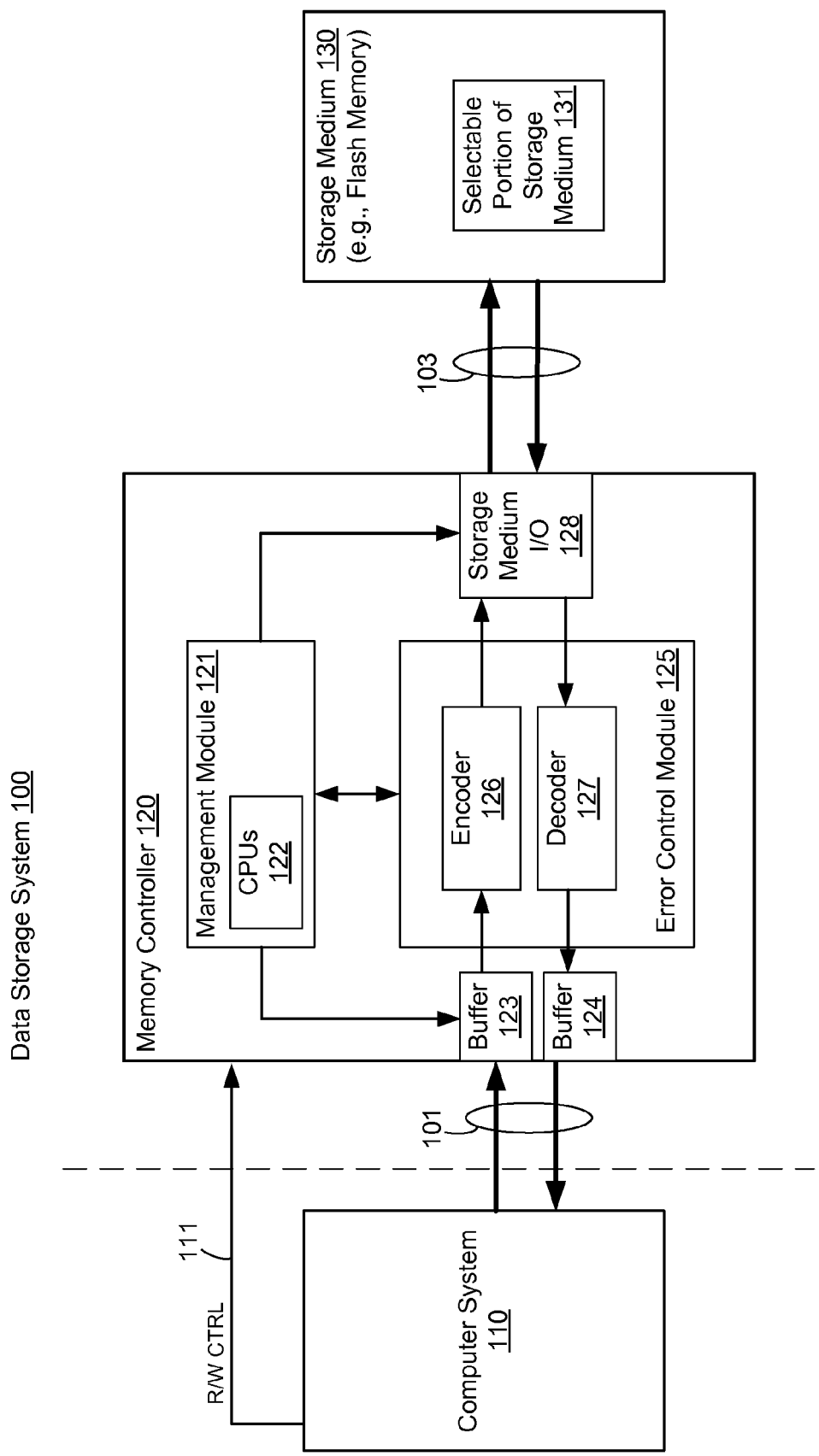
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various implementations described herein include systems, methods and/or devices used to improve the error correction capability when using soft information error control decoding. Some implementations include systems, methods and/or devices to obtain and utilize error information for determining soft information values used for decoding data read from a storage medium.

More specifically, some implementations include a method for decoding data. In some implementations, the method includes selecting a first set of one or more soft information values and receiving a read data command. The method further includes responding to the read data command by (1) initiating performance of a data access operation to access data in a storage medium, the data access operation producing a syndrome weight, (2) determining a first indicator based at least in part on the syndrome weight, (3) based on the first indicator, selecting a second set of one or more soft information values, and (4) decoding data obtained from the data access operation using the second set of one or more soft information values to produce a result.

In some embodiments, the first set of one or more soft information values includes default LLR values for at least a portion of the storage medium.

In some embodiments, the storage medium includes a plurality of storage devices (e.g., the storage medium is distributed across multiple semiconductor die) and the data access operation produces a syndrome weight for each of the plurality of storage devices. In these embodiments, determining the first indicator includes, for each storage device of the plurality of storage devices, determining a respective first indicator for the storage device based at least in part on the syndrome weight for the storage device. Further, selecting a second set of one or more soft information values includes, for each storage device of the plurality of storage devices, selecting, based on the respective first indicator for the storage device, a respective second set of one or more soft information values.

In another aspect, a method for decoding data includes selecting a first set of one or more soft information values, receiving a multiplicity of read data commands, and in accordance with the multiplicity of read data commands, initiating performance of data access operations to access data in a storage medium, the data access operations producing syndrome weights (as well as read data, if decoding the accessed data is successful). The method further includes determining an average syndrome weight in accordance with the syndrome weights produced by the data access operations, and determining a first indicator based at least in part on the determined average syndrome weight. Based on the first indicator, the method includes selecting a second set of one or more soft information values. After selecting the second set of one or more soft information values, the method includes decoding data for a subsequent read data command using the second set of one or more soft information values.

In some embodiments, the first set of one or more soft information values includes default LLR values for at least a portion of the storage medium, and the default LLR values are updated based at least in part on the first indicator.

In yet another aspect, a method for decoding data includes selecting a first set of one or more soft information values and receiving a read data command. The method further includes responding to the read data command by (1) initiating performance of a data access operation to access data in a storage medium, the data access operation producing a syndrome weight, (2) determining a first indicator based at least in part on the syndrome weight, (3) based on the first indicator, adjusting the first set of one or more soft information values to obtain a second set of one or more soft information values, and (4) decoding data obtained from the data access operation using the second set of one or more soft information values to produce a result.

In some embodiments, adjusting the first set of one or more soft information values comprises applying a predefined mathematical function to the first set of one or more soft information values to obtain the second set of one or more soft information values.

In some embodiments, the predefined mathematical function adds a predefined vector of values to the first set of one or more soft information values to obtain the second set of one or more soft information values.

In some embodiments, the storage medium includes a plurality of storage devices (e.g., the storage medium is distributed across multiple semiconductor die) and the data access operation produces a syndrome weight for each of the plurality of storage devices. In these embodiments, determining the first indicator includes, for each storage device of the plurality of storage devices, determining a respective first indicator for the storage device based at least in part on the syndrome weight for the storage device. Further, in these embodiments, adjusting the first set of one or more soft information values to obtain a second set of one or more soft information values includes, for each storage device of the plurality of storage devices, adjusting, based on the respective first indicator for the storage device, a respective first set of one or more soft information values to obtain a respective second set of one or more soft information values.

In some embodiments, any of the methods described above are performed by a memory controller distinct from and coupled to the storage medium by one or more connections, and the data read commands are received from a device distinct from the memory controller.

In another aspect, a device operable to decode data is configured to decode data in accordance with any of the methods described above.

In yet another aspect, a non-transitory computer readable storage medium stores one or more programs configured for execution by a device coupled to a storage medium, the one or more programs comprising instructions for causing the device and/or storage medium to decode data in accordance with any of the methods described above.

Numerous details are described herein in order to provide a thorough understanding of the example implementations illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure more pertinent aspects of the implementations described herein.

FIG. 1 is a diagram of an implementation of a data storage system 100, in accordance with some embodiments. While some example features are illustrated, various other features have not been illustrated for the sake of brevity and so as not to obscure more pertinent aspects of the example implementations disclosed herein. To that end, as a non-limiting example, the data storage system 100 includes a memory controller 120, and a storage medium 130, and is used in conjunction with a computer system 110. In some implementations, storage medium 130 is a single flash memory device while in other implementations storage medium 130 includes a plurality of flash memory devices. In some implementations, storage medium 130 is NAND-type flash memory or NOR-type flash memory. Further, in some implementations memory controller 120 is a solid-state drive (SSD) controller. However, other types of storage media may be included in accordance with aspects of a wide variety of implementations.

Computer system 110 is coupled to memory controller 120 through data connections 101. However, in some implementations computer system 110 includes memory controller 120 as a component and/or a sub-system. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host or host system. In some implementations, computer system 110 includes one or more processors, one or more types of memory, a display and/or other user interface components such as a keyboard, a touch screen display, a mouse, a trackpad, a digital camera and/or any number of supplemental devices to add functionality.

Storage medium 130 is coupled to memory controller 120 through connections 103. Connections 103 are sometimes called data connections, but typically convey commands in addition to data, and optionally convey metadata, error correction information and/or other information in addition to data values to be stored in storage medium 130 and data values read from storage medium 130. Furthermore, in some implementations memory controller 120 and storage medium 130 are embedded in a host device, such as a mobile device, tablet, other computer or computer controlled device, and the methods described herein are performed by the embedded memory controller. Storage medium 130 may include any number (i.e., one or more) of memory devices including, without limitation, non-volatile semiconductor memory devices, such as flash memory. For example, flash memory devices can be configured for enterprise storage suitable for applications such as cloud computing, or for caching data stored (or to be stored) in secondary storage, such as hard disk drives. Additionally and/or alternatively, flash memory can also be configured for relatively smaller-scale applications such as personal flash drives or hard-disk replacements for personal, laptop and tablet computers.

Storage medium 130 is divided into a number of addressable and individually selectable blocks, such as selectable portion 131. In some implementations, the individually selectable blocks are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some implementations (e.g., using some types of flash memory), the smallest individually accessible unit of a data set, however, is a sector, which is a subunit of a page. That is, a block includes a plurality of pages, each page contains a plurality of sectors, and each sector is the minimum unit of data for reading data from the flash memory device.

For example, one block comprises any number of pages, for example, 64 pages, 128 pages, 256 pages or another suitable number of pages. Blocks are typically grouped into a plurality of zones. Each block zone can be independently managed to some extent, which increases the degree of parallelism for parallel operations and simplifies management of storage medium 130.

As noted above, while data storage densities of non-volatile semiconductor memory devices are generally increasing, a drawback of increasing storage density is that the stored data is more prone to being stored and/or read erroneously. As described in greater detail below, error control coding can be utilized to limit the number of uncorrectable errors that are introduced by electrical fluctuations, defects in the storage medium, operating conditions, device history, write-read circuitry, etc., or a combination of these and various other factors.

In some implementations, memory controller 120 includes a management module 121, an input buffer 123, an output buffer 124, an error control module 125 and a storage medium interface (I/O) 128. Memory controller 120 may include various additional features that have not been illustrated for the sake of brevity and so as not to obscure more pertinent features of the example implementations disclosed herein, and that a different arrangement of features may be possible. Input and output buffers 123,124 provide an interface to computer system 110 through data connections 101. Similarly, storage medium I/O 128 provides an interface to storage medium 130 though connections 103. In some implementations, storage medium I/O 128 includes read and write circuitry, including circuitry capable of providing reading signals to storage medium 130 (e.g., reading threshold voltages for NAND-type flash memory).

In some implementations, management module 121 includes one or more processing units (CPUs, also sometimes called processors) 122 configured to execute instructions in one or more programs (e.g., in management module 121). In some implementations, the one or more CPUs 122 are shared by one or more components within, and in some cases, beyond the function of memory controller 120. Management module 121 is coupled to input buffer 123, output buffer 124 (connection not shown), error control module 125 and storage medium I/O 128 in order to coordinate the operation of these components.

Error control module 125 is coupled to storage medium I/O 128, input buffer 123 and output buffer 124. Error control module 125 is provided to limit the number of uncorrectable errors inadvertently introduced into data. In some embodiments, error control module 125 is executed in software by the one or more CPUs 122 of management module 121, and, in other embodiments, error control module 125 is implemented in whole or in part using special purpose circuitry to perform encoding and decoding functions. To that end, error control module 125 includes an encoder 126 and a decoder 127. Encoder 126 encodes data by applying an error control code to produce a codeword, which is subsequently stored in storage medium 130.

When the encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand some algorithms, such as the Viterbi algorithm, may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 130 from computer system 110. The data held in input buffer 123 is made available to encoder 126, which encodes the data to produce one or more codewords. The one or more codewords are made available to storage medium I/O 128, which transfers the one or more codewords to storage medium 130 in a manner dependent on the type of storage medium being utilized.

A read operation is initiated when computer system (host) 110 sends one or more host read commands on control line 111 to memory controller 120 requesting data from storage medium 130. Memory controller 120 sends one or more read access commands to storage medium 130, via storage medium I/O 128, to obtain raw read data in accordance with memory locations (addresses) specified by the one or more host read commands. Storage medium I/O 128 provides the raw read data (e.g., comprising one or more codewords) to decoder 127. If the decoding is successful, the decoded data is provided to output buffer 124, where the decoded data is made available to computer system 110. In some implementations, if the decoding is not successful, memory controller 120 may resort to a number of remedial actions or provide an indication of an irresolvable error condition.

Flash memory devices utilize memory cells to store data as electrical values, such as electrical charges or voltages. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage the charge creates, is used to represent one or more data values. In some implementations, during a read operation, a reading threshold voltage is applied to the control gate of the transistor and the resulting sensed current or voltage is mapped to a data value.

The terms "cell voltage" and "memory cell voltage," in the context of flash memory cells, means the threshold voltage of the memory cell, which is the minimum voltage that needs to be applied to the gate of the memory cell's transistor in order for the transistor to conduct current. Similarly, reading threshold voltages (sometimes also called reading signals and reading voltages) applied to a flash memory cells are gate voltages applied to the gates of the flash memory cells to determine whether the memory cells conduct current at that gate voltage. In some implementations, when a flash memory cell's transistor conducts current at a given reading threshold voltage, indicating that the cell voltage is less than the reading threshold voltage, the raw data value for that read operation is a "1" and otherwise the raw data value is a "0."

Figure 2A:
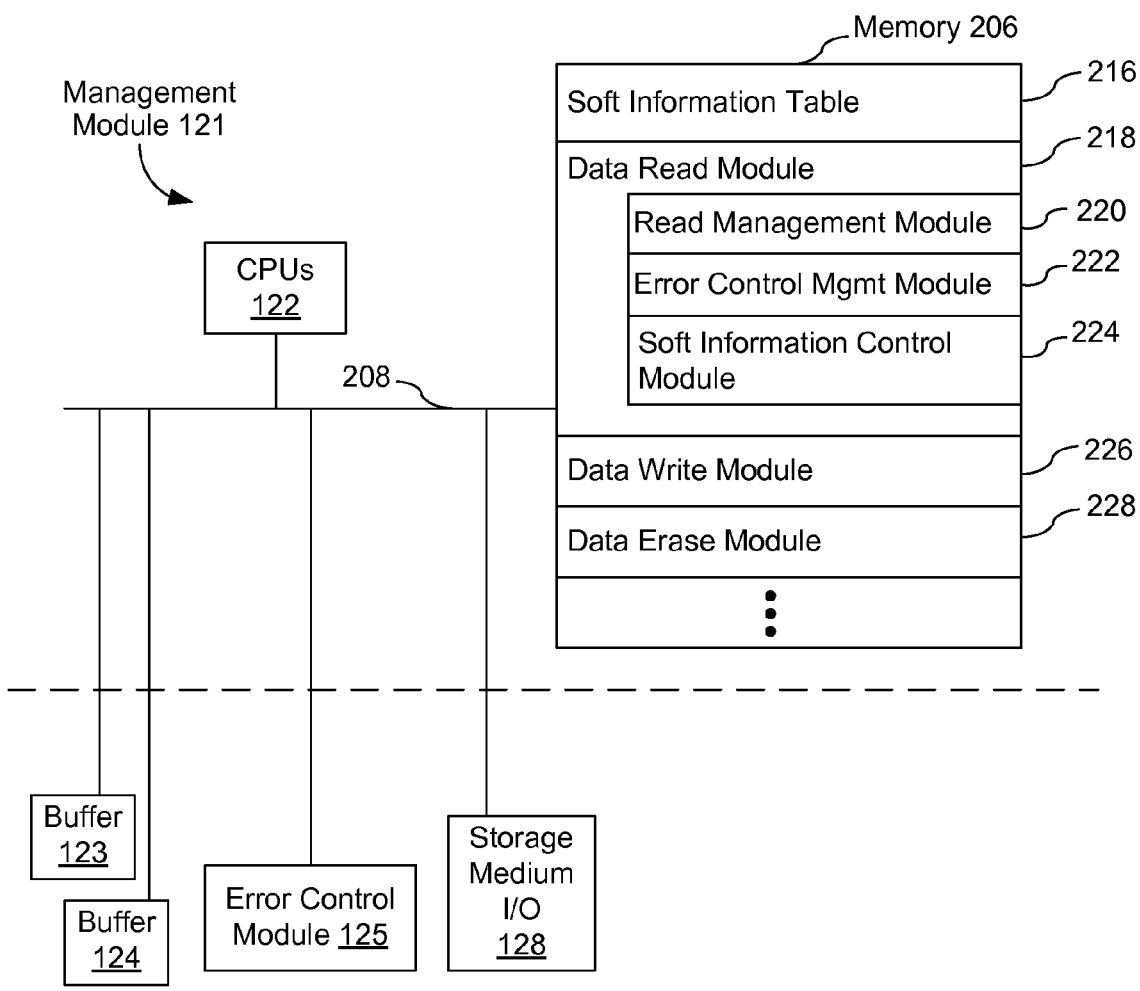
FIG. 2A is a block diagram illustrating an implementation of a management module, in accordance with some embodiments.

FIG. 2A is a block diagram illustrating an exemplary management module 121, in accordance with some embodiments. Management module 121 typically includes one or more processing units (CPUs) 122 for executing modules, programs and/or instructions stored in memory 206 and thereby performing processing operations, memory 206, and one or more communication buses 208 for interconnecting these components. Communication buses 208 optionally include circuitry (sometimes called a chipset) that interconnects and controls communications between system components. Management module 121 is coupled to buffer 123, buffer 124, error control module 125, and storage medium I/O 128 by communication buses 208. Memory 206 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 206 optionally includes one or more storage devices remotely located from the CPU(s) 122. Memory 206, or alternately the non-volatile memory device(s) within memory 206, comprises a non-transitory computer readable storage medium. In some embodiments, memory 206, or the computer readable storage medium of memory 206 stores the following programs, modules, and data structures, or a subset thereof:

- a soft information table 216 that includes a table of soft information values used for decoding data read from a storage medium;
- a data read module 218 that is used for reading data from a storage medium;
- a data write module 226 that is used for writing data to a storage medium; and
- a data erase module 228 that is used for erasing data from a storage medium.

In some embodiments, the data read module 218 optionally includes the following modules or sub-modules, or a subset thereof:

- a read management module 220 that is used for controlling or managing execution of read commands received from a host device such as computer system 110 (FIG. 1);
- an error control management module 222 that is used to receive error indicators (e.g., syndrome weights) from error control module 125, and optionally to control operation of error control module 125; and
- a soft information control module 224 that is used for selecting and/or adjusting soft information values from soft information table 216.

Each of the above identified elements may be stored in one or more of the previously mentioned memory devices, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 206 may store a subset of the modules and data structures identified above. Furthermore, memory 206 may store additional modules and data structures not described above. In some embodiments, the programs, modules, and data structures stored in memory 206, or the computer readable storage medium of memory 206, provide instructions for implementing any of the methods described below with reference to FIGS. 5, 6, and 7A-7B.

Although FIG. 2A shows a management module 121, FIG. 2A is intended more as functional description of the various features which may be present in a management module than as a structural schematic of the embodiments described herein. In practice, and as recognized by those of ordinary skill in the art, items shown separately could be combined and some items could be separated.

Figure 2B:
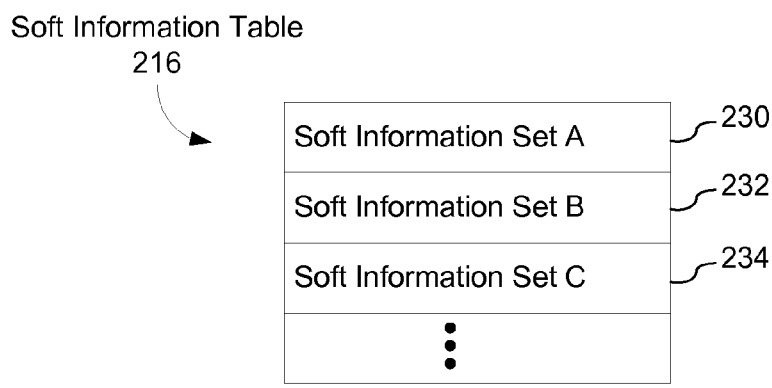
FIG. 2B is a block diagram illustrating an implementation of a soft information table, in accordance with some embodiments.

FIG. 2B is a block diagram illustrating an implementation of a soft information table 216, in accordance with some embodiments. In some implementations, soft information table 216 comprises one or more soft information sets, including soft information set A 230, soft information set B 232, and soft information set C 234. In some implementations, a soft information set (e.g., soft information set A 230, soft information set B 232, or soft information set C 234) includes one or more soft information values. In some embodiments, soft information includes transition probabilities and/or log-likelihood ratios (LLRs). In some embodiments, soft information values are sometimes also known as probabilistic decoder values. In some embodiments, soft information sets from soft information table 216 are stored as components of a characterization vector (e.g., LLR values 340 in characterization vector 320, FIG. 3C) associated with the storage medium or a portion of the storage medium.

In some implementations, when encoded data is read from a storage medium (e.g., storage medium 130, FIG. 1), a decoder (e.g., decoder 127, FIG. 1, a component of error control module 125, FIGS. 1 and 2A) applies a decoding process to the encoded data to recover the data, and to correct errors in the recovered data within the error correcting capability of the error control code. In some implementations, after zero iterations or after one iteration of the decoding process, the decoder determines an error indicator. In some embodiments, the error indicator is a syndrome weight, which indicates the number of bit errors detected in a given iteration of the decoding process. A syndrome weight of zero indicates decoding was successful and the data has been recovered. In some embodiments, based on the error indicator, a memory management module (e.g., management module 121, FIGS. 1 and 2A) selects and/or adjusts a set of one or more soft information values to use for decoding. For example, if the syndrome weight is determined to be in one range, soft information control module 224 (FIG. 2A) selects soft information set A 230; if the syndrome weight is determined to be in another range, soft information control module 224 selects soft information set B 232; if the syndrome weight is determined to be in yet another range, soft information control module 224 selects soft information set C 234. In some embodiments, soft information control module 224 (FIG. 2A) adjusts a set of soft information values to use for decoding, as described in more detail with respect to FIGS. 7A-7B.

In some embodiments, data read module 218 (FIG. 2A) obtains symbol transition information, which includes detecting and/or identifying symbol read errors in the read data and converting the symbol transition information into soft information (e.g., transition probabilities or LLRs). More specifically, in some implementations, data read module 218 (FIG. 2A) assigns at least one soft information value, in the form of an LLR, to each bit-tuple in the hard-decision read data from the read operation to produce a sequence of LLRs $y_{LLR}=(y_0, y_1, \ldots, y_{n-1})$, where n is the codeword length.

In some implementations, LLRs can be generated from transition probabilities. To that end, a basis for a characterization process may be established as follows. Let X be the set of $Q=2^q$ q-bit hard bit-tuples that can be written to a flash memory cell, where each of the q hard bits is from a respective one of q pages. For example, when q=2, X={11,01,00,10}. Let Y be the set of voltage level ranges of a q-bit hard bit-tuple and optionally additional soft bit-tuples read out from the flash memory cell. The number of voltage level ranges in Y is at least Q, and more generally is based on the number of reading threshold voltages used when reading the flash memory cell. Due to electrical fluctuations, defects in the storage medium, operating conditions, device history, and/or write-read circuitry, etc., the read out voltage level range y∈Y from a flash memory cell may be different from the written voltage level, wherein the written voltage level corresponds to the hard bit-tuple x∈X. The set of actual voltages for each level in memory cell typically has a distribution or set of possible values, as described below with reference to FIG. 4C. The voltage distributions are affected by factors such as page location, page type, program/erase (PE) cycles, data mode (operation, retention), temperature, etc. In some implementations, the voltage distribution and the variation of the voltage distribution may be used to generate soft information values, such as transition probabilities and/or LLRs, based on a device characterization process.

The following describes an example in which q=2 (i.e., 2 bits per cell in a MLC flash memory). However, those skilled in the art will appreciate that the 2-bit implementation may be extended to other types of MLC flash memory that have more bits (q≥3) per memory cell.

Each combination of storage medium characterization parameter values represents a respective state of a storage medium (e.g., a flash memory device) that may be characterized in a device characterization process, and may exist for other devices produced by the same manufacturing process.

With respect to MLC flash memory (e.g., storage media 130, FIG. 1), there are generally two types of read operations that may be performed on MLC flash memory that result in disjoint sets of transition probabilities. One is a single-page read, which includes reading the respective bits of a particular page from a number of q-page MLC flash memory cells. For example, for a 2-page flash memory, the two constituent pages are referred to as the lower page and the upper page, where the lower page bit is typically the least significant bit of the 2-bit bit-tuple, and the upper page is the most significant bit. For the single-page read scenario, one of the upper page and lower page bit from a number of MLC flash memory cells is read. Thus, a lower-page read delivers a sequence of respective lower-page bits from a number of 2-page MLC flash memory cells. The other type of read is a joint-page read, which generally includes reading the respective bits of two or more pages from a number of q-page MLC flash memory cells. So, for a 2-page (i.e., q=2) flash memory, a joint-page read delivers a sequence of respective 2-bit bit-tuples from a number of 2-page MLC flash memory cells. For each type of read, and a combination of storage medium characterization parameter values, one or more transition probabilities tables is generated by comparing write data and read data.

FIG. 3A, for example, is a transition probability table 300 associated with either a SLC flash memory cell or a single-page read of a MLC flash memory cell for a particular combination of storage medium characterization parameter values. The transition probability values $p_{00}$, $p_{10}$, $p_{01}$, $p_{11}$ in transition probability table 300 are determined for a single-page read of a MLC flash memory cell as follows. Let $x_b$ be the data bit written to a lower page and $y_b$ be the voltage level range read from the same lower page. Each transition probability $p_{00}$, $p_{10}$, $p_{01}$, $p_{11}$ is determined as a conditional probability $p_{i,j}=p(y_b=V_j|x_b=i)$ that a particular voltage level range $y_b=V_j$ is read when the bit $x_b=i$ was written. For example, the transition probability $p_{00}$ is the probability that a voltage level range $V_0$ was read given that a bit "0" was written, and the transition probability $p_{01}$ is the probability that a voltage level range $V_1$ was read given that a bit "0" was written, etc. Moreover, the transition probabilities, and subsequently the LLRs, generated for the single-page read correspond to bit-tuples each including a single bit even though the MLC flash memory cell stores a bit-tuple including two or more bits. Those skilled in the art will appreciate from the present disclosure that the transition probability table for the upper page is similarly obtained by writing and reading upper page data for a combination of storage medium characterization parameter values. Those skilled in the art will also appreciate from the present disclosure that for each of the possible write bit values, the transition probabilities satisfy equation (1):

$$\sum_{j=0}^{2q-1} (p_{ij}) = 1. \tag{1}$$

Once the transition probabilities have been generated for a combination of storage medium characterization parameter values, corresponding LLRs may be generated and stored in a collection of characterization vectors. In some implementations, the transition probabilities are stored in a collection of characterization vectors instead of, or in addition to, the LLRs. However, LLRs provide a more compact representation of the soft information provided by the transition probabilities.

In some implementations, LLRs for a combination of storage medium characterization parameter values may be generated using equation (2) as follows:

$$LLR(y_k) \equiv \log\left(\frac{P(x_k = 0 \mid y)}{P(x_k = 1 \mid y)}\right). \tag{2}$$

In equation (2), $y_k$ represents the k-th bit read from a q-bit multi-level memory cell, which corresponds to a read out voltage level range y∈Y for 0≤k<q. Equation (2) can be rewritten as (2a), in which $X_k^{(0)}$ denotes the subset of the written bits X where the k-th bit is 0, $X_k^{(1)}$ denotes the subset of the written bits X where the k-th bit is 1, and $X_k^{(0)} \cup X_k^{(1)}$ =X.

$$LLR(y_k) = \log\left(\frac{\sum_{a \in X_k^{(0)}} P(y \mid x = a)}{\sum_{a \in X_k^{(1)}} P(y \mid x = a)}\right) \quad (2a)$$

For a single-page read, equation (2a) simplifies to equations (3) and (4):

$$LLR(V_0) = \log\left(\frac{P(y_b = V_0 \mid x_b = 0)}{P(y_b = V_0 \mid x_b = 1)}\right) = \log\left(\frac{p_{00}}{p_{10}}\right) \quad (3)$$

$$LLR(V_1) = \log\left(\frac{P(y_b = V_1 \mid x_b = 0)}{P(y_b = V_1 \mid x_b = 1)}\right) = \log\left(\frac{p_{01}}{p_{11}}\right) \quad (4)$$

For a joint-page read, equation (2a) does not simplify as concisely as above for $y_b = V_0$ and $y_b = V_1$. However, as an example for $y = V_{11}$, equation (2a) may be written as:

$$LLR(V_{11}, \text{upper page}) = \log\left(\frac{P(y = V_{11} \mid x = 00) + P(y = V_{11} \mid x = 10)}{P(y = V_{11} \mid x = 11) + P(y = V_{11} \mid x = 01)}\right) \quad (5)$$

$$LLR(V_{11}, \text{lower page}) = \log\left(\frac{P(y = V_{11} \mid x = 01) + P(y = V_{11} \mid x = 00)}{P(y = V_{11} \mid x = 11) + P(y = V_{11} \mid x = 10)}\right) \quad (6)$$

Those skilled in the art will appreciate from the present disclosure, and in particular equations (2a), (5) and (6), how to obtain the LLRs for y=01, 00 and 10.

FIG. 3B is a block diagram illustrating an implementation of a characterization vector table 310, in accordance with some embodiments. Characterization vector table 310 includes a collection of characterization vectors 311, that each store characterization data, such as symbol transition information for bit-tuples (e.g., soft information values, including transition probabilities and/or log-likelihood ratios (LLRs)) and one or more reading threshold voltage values, associated with a portion of a storage medium (e.g., a die, block zone, block, or word line portion of storage medium 130, FIG. 1). In some embodiments, in the collection of characterization vectors 311, each vector (e.g., vector 311-1, vector 311-2, . . . , vector 311-n) stores characterization data derived at each of at least two time periods (e.g., time T-1 and time T-2, or X program-erase (PE) cycles and 2×PE cycles). In some implementations, the characterization data stored in the characterization vectors 311 is statistically derived. In some implementations, the characterization data further includes storage medium characterization parameter values, such as a current count of program-erase cycles associated with a portion of a storage medium (e.g., storage medium 130, FIG. 1) and a word line zone value associated with a portion of the storage medium. For example, without limitation, in some embodiments in which a storage medium (e.g., storage medium 130, FIG. 1) includes multiple die, characterization vector table 310 includes at least one characterization vector for each distinct die. In another example, in some embodiments, characterization vector table 310 includes a set of distinct characterization vectors 311 for each die in a storage medium (e.g., storage medium 130, FIG. 1), and the set of distinct characterization vectors 311 for each die includes at least one distinct characterization vector for each block, or each block zone of a plurality of block zones, in the die. In some embodiments, the soft information values from soft information table 216 (FIG. 2B) are stored as components of characterization vectors 311. More detailed example implementations of characterization vectors 311 are described below with reference to FIG. 3C.

FIG. 3C is a schematic diagram of an implementation of a characterization vector 320 (e.g., corresponding to any one of characterization vectors 311 shown in FIG. 3B); in some implementations, characterization vector 320 includes LLR values 340 produced from transition probability values in table 300 of FIG. 3A. In some implementations, characterization vector 320 includes a reading threshold voltage(s) field 330 and a LLR values field 340. In some implementations, characterization vector 320 is a data structure that facilitates decoding raw data values from a storage medium (e.g., storage medium 130, FIG. 1). In some implementations, respective transition probability values (e.g., based on transition probability table 300) and/or LLR values (e.g., LLR($V_0$) and LLR($V_1$)) for a single-page read and/or a joint-page read are stored in a respective characterization vector for a combination of storage medium characterization parameter values for a portion of a storage medium. In some embodiments, a memory management module (e.g., management module 121, FIG. 1) selects a set of LLR values (e.g., a default set of LLR values 341, a set of LLR values for syndrome weight range A 342, a set of LLR values for syndrome weight range B 343, or a set of LLR values for syndrome weight range C 344) based at least on a respective syndrome weight and one or more storage medium characterization parameter values associated with the storage medium or a portion of the storage medium. For example, for a given characterization vector 320, if the syndrome weight is determined to be in one range, the set of LLR values for syndrome weight range A 342 is selected; if the syndrome weight is determined to be in another range, the set of LLR values for syndrome weight range B 343 is selected; if the syndrome weight is determined to be in yet another range, the set of LLR values for syndrome weight range C 344 is selected. In some embodiments, a default set of LLR values (e.g., default set of LLR values 341) is updated, as described in more detail with respect to FIG. 6.

As discussed below with reference to FIG. 4A, a single-level flash memory cell (SLC) stores one bit ("0" or "1"). Thus, the storage density of a SLC memory device is one bit of information per memory cell. A multi-level flash memory cell (MLC), however, can store two or more bits of information per cell by using different ranges within the total voltage range of the memory cell to represent a multi-bit bit-tuple. In turn, the storage density of a MLC memory device is multiple-bits per cell (e.g., two bits per memory cell).

Figure 4A:
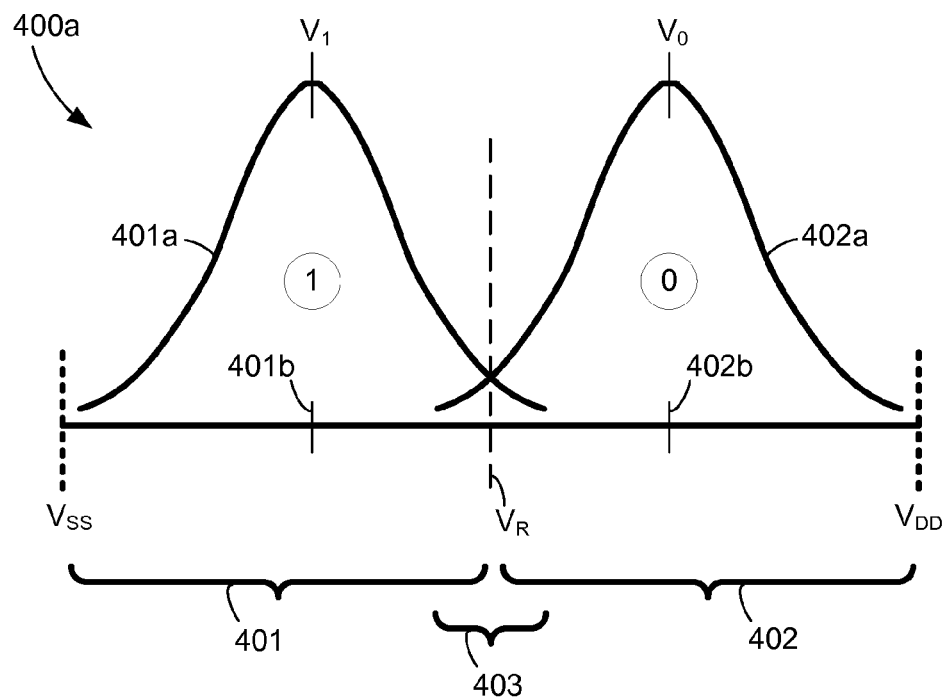
FIG. 4A is a prophetic diagram of voltage distributions that may be found in a single-level flash memory cell (SLC) with a low syndrome weight, in accordance with some embodiments.

FIG. 4A is a simplified, prophetic diagram of voltage distributions 400a found in a single-level flash memory cell (SLC) with a low syndrome weight, in accordance with some embodiments. The voltage distributions 400a shown in FIG. 4A have been simplified for illustrative purposes. In this example, the SLC's voltage range extends approximately from a voltage, $V_{SS}$, at a source terminal of an NMOS transistor to a voltage, $V_{DD}$, at a drain terminal of the NMOS transistor. As such, voltage distributions 400a extend between $V_{SS}$ and $V_{DD}$.

Sequential voltage ranges 401 and 402 between source voltage $V_{SS}$ and drain voltage $V_{DD}$ are used to represent corresponding bit values "1" and "0," respectively. Each voltage range 401, 402 has a respective center voltage $V_1$ 401b, $V_0$ 402b. As described above, in many circumstances the memory cell current sensed in response to an applied reading threshold voltages is indicative of a memory cell voltage different from the respective center voltage $V_1$ 401b or $V_0$ 402b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 401, 402 also has a respective voltage distribution 401a, 402a that may occur as a result of any number of a combination of error-inducing factors, examples of which are identified above.

In some implementations, a reading threshold voltage $V_R$ is applied between adjacent center voltages (e.g., applied proximate to the halfway region between adjacent center voltages $V_1$ 401b and $V_0$ 402b). Optionally, in some implementations, the reading threshold voltage is located between voltage ranges 401 and 402. In some implementations, reading threshold voltage $V_R$ is applied in the region proximate to where the voltage distributions 401a and 402a overlap, which is not necessarily proximate to the halfway region between adjacent center voltages $V_1$ 401b and $V_0$ 402b.

Figure 4B:
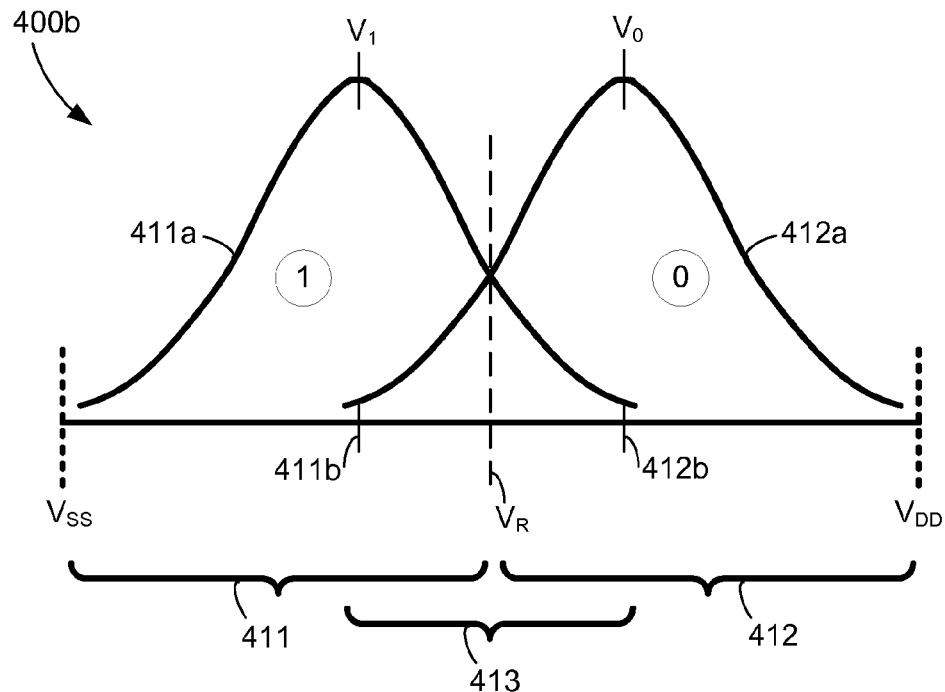
FIG. 4B is a prophetic diagram of voltage distributions that may be found in a single-level flash memory cell (SLC) with a high syndrome weight, in accordance with some embodiments.

In FIG. 4A, the relatively small overlap 403 of voltage distributions 401a and 402a indicates a relatively small area (of the voltage distributions) in which errors occur when reading from the memory cell, and thus relates to a low starting syndrome weight. In FIG. 4B, the relatively large overlap 413 of voltage distributions 411a and 412a indicates a larger area (of the voltage distributions) in which errors occur when reading from the memory cell, and thus relates to a high starting syndrome weight. In some embodiments, when a data access operation produces a low syndrome weight, one set of soft information values is selected (e.g., soft information set A 230, FIG. 2B), and when a data access operation produces a high syndrome weight, another set of soft information values is selected (e.g., soft information set C 234, FIG. 2B).

Figure 4C:
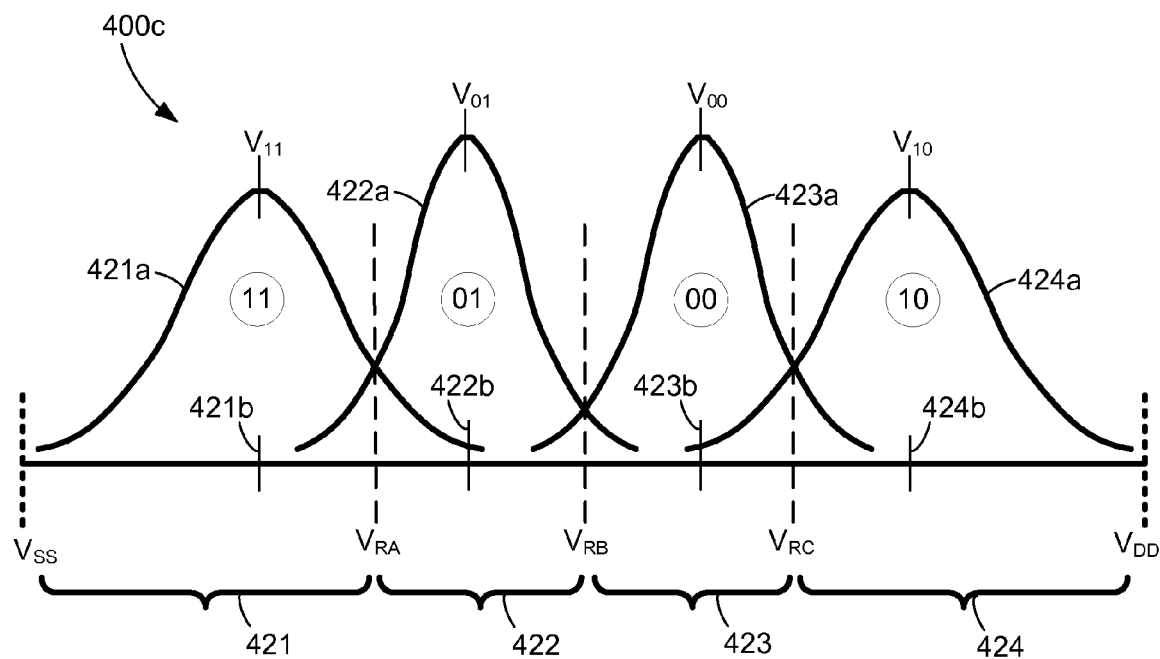
FIG. 4C is a prophetic diagram of voltage distributions that may be found in a multi-level flash memory cell (MLC) over time, in accordance with some embodiments.

Although FIG. 4A illustrates an example using a single-level flash memory cell, this scheme is also applicable to a multi-level flash memory cell (e.g., as illustrated in FIG. 4C).

FIG. 4B is a simplified, prophetic diagram of voltage distributions 400b found in a single-level flash memory cell (SLC) with a high syndrome weight, in accordance with some embodiments. Explanations provided above in connection with FIG. 4A, with respect to voltage distributions 400a, sequential voltage ranges 401 and 402, center voltages $V_1$ 401b and $V_0$ 402b, voltage distributions 401a and 402a and their overlap 403, and reading threshold voltage $V_R$ are equally applicable to voltage distributions 400b, sequential voltage ranges 411 and 412, center voltages $V_1$ 411b and $V_0$ 412b, voltage distributions 411a and 412a and their overlap 413, and reading threshold voltage $V_R$ as shown in FIG. 4B, except as described next.

In FIG. 4B, the relatively large overlap 413 of voltage distributions 411a and 412a indicates a larger area (of the voltage distributions) in which errors occur when reading from the memory cell, and thus relates to a high starting syndrome weight. As described above, when a data access operation produces a high syndrome weight, the set of soft information values selected for use in decoding is different from the set of soft information values selected when the data access operation produces a low syndrome weight.

Although FIG. 4B illustrates an example using a single-level flash memory cell, this scheme is also applicable to a multi-level flash memory cell (e.g., as illustrated in FIG. 4C).

In order to increase storage density in flash memory, flash memory has developed from single-level (SLC) cell flash memory to multi-level cell (MLC) flash memory so that two or more bits can be stored by each memory cell. As discussed below with reference to FIG. 4C, a MLC flash memory device is used to store multiple bits by using voltage ranges within the total voltage range of the memory cell to represent different bit-tuples. A MLC flash memory device is typically more error-prone than a SLC flash memory device created using the same manufacturing process because the effective voltage difference between the voltages used to store different data values is smaller for a MLC flash memory device. Moreover, due to any number of a combination of factors, such as electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below with reference to FIG. 4C, the impact of such errors can be reduced by gray-coding the data, such that adjacent voltage ranges represent single-bit changes between bit-tuples.

FIG. 4C is a simplified, prophetic diagram of voltage distributions 400c found in a multi-level flash memory cell (MLC) over time, in accordance with some embodiments. The voltage distributions 400c shown in FIG. 4C have been simplified for illustrative purposes. The cell voltage of a MLC approximately extends from a voltage, $V_{SS}$, at the source terminal of a NMOS transistor to a voltage, $V_{DD}$, at the drain terminal. As such, voltage distributions 400c extend between $V_{SS}$ and $V_{DD}$.

Sequential voltage ranges 421, 422, 423, 424 between the source voltage $V_{SS}$ and drain voltages $V_{DD}$ are used to represent corresponding bit-tuples "11," "01," "00," "10," respectively. Each voltage range 421, 422, 423, 424 has a respective center voltage 421b, 422b, 423b, 424b. Each voltage range 421, 422, 423, 424 also has a respective voltage distribution 421a, 422a, 423a, 424a that may occur as a result of any number of a combination of factors, such as electrical fluctuations, defects in the storage medium, operating conditions, device history (e.g., number of program-erase (PE) cycles), and/or imperfect performance or design of write-read circuitry.

Ideally, during a write operation, the charge on the floating gate of the MLC would be set such that the resultant cell voltage is at the center of one of the ranges 421, 422, 423, 424 in order to write the corresponding bit-tuple to the MLC. Specifically, the resultant cell voltage would be set to one of $V_{11}$ 421b, $V_{01}$ 422b, $V_{00}$ 423b and $V_{10}$ 424b in order to write a corresponding one of the bit-tuples "11," "01," "00" and "10." In reality, due to the factors mentioned above, the initial cell voltage may differ from the center voltage for the data written to the MLC.

Reading threshold voltages $V_{RA}$, $V_{RB}$ and $V_{RC}$ are positioned between adjacent center voltages (e.g., positioned at or near the halfway point between adjacent center voltages) and, thus, define threshold voltages between the voltage ranges 421, 422, 423, 424. During a read operation, one of the reading threshold voltages $V_{RA}$, $V_{RB}$ and $V_{RC}$ is applied to determine the cell voltage using a comparison process. However, due to the various factors discussed above, the actual cell voltage, and/or the cell voltage received when reading the MLC, may be different from the respective center voltage $V_{11}$ 421b, $V_{01}$ 422b, $V_{00}$ 423b or $V_{10}$ 424b corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drift" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift."

One way to reduce the impact of a cell voltage drifting from one voltage range to an adjacent voltage range is to gray-code the bit-tuples. Gray-coding the bit-tuples includes constraining the assignment of bit-tuples such that a respective bit-tuple of a particular voltage range is different from a respective bit-tuple of an adjacent voltage range by only one bit. For example, as shown in FIG. 3B, the corresponding bit-tuples for adjacent ranges 301 and 302 are respectively "11" and "01," the corresponding bit-tuples for adjacent ranges 302 and 303 are respectively "01" and "00," and the corresponding bit-tuples for adjacent ranges 303 and 304 are respectively "00" and "10." Using gray-coding, if the cell voltage drifts close to a read comparison voltage level, the error is typically limited to a single bit within the 2-bit bit-tuple.

Figure 5:
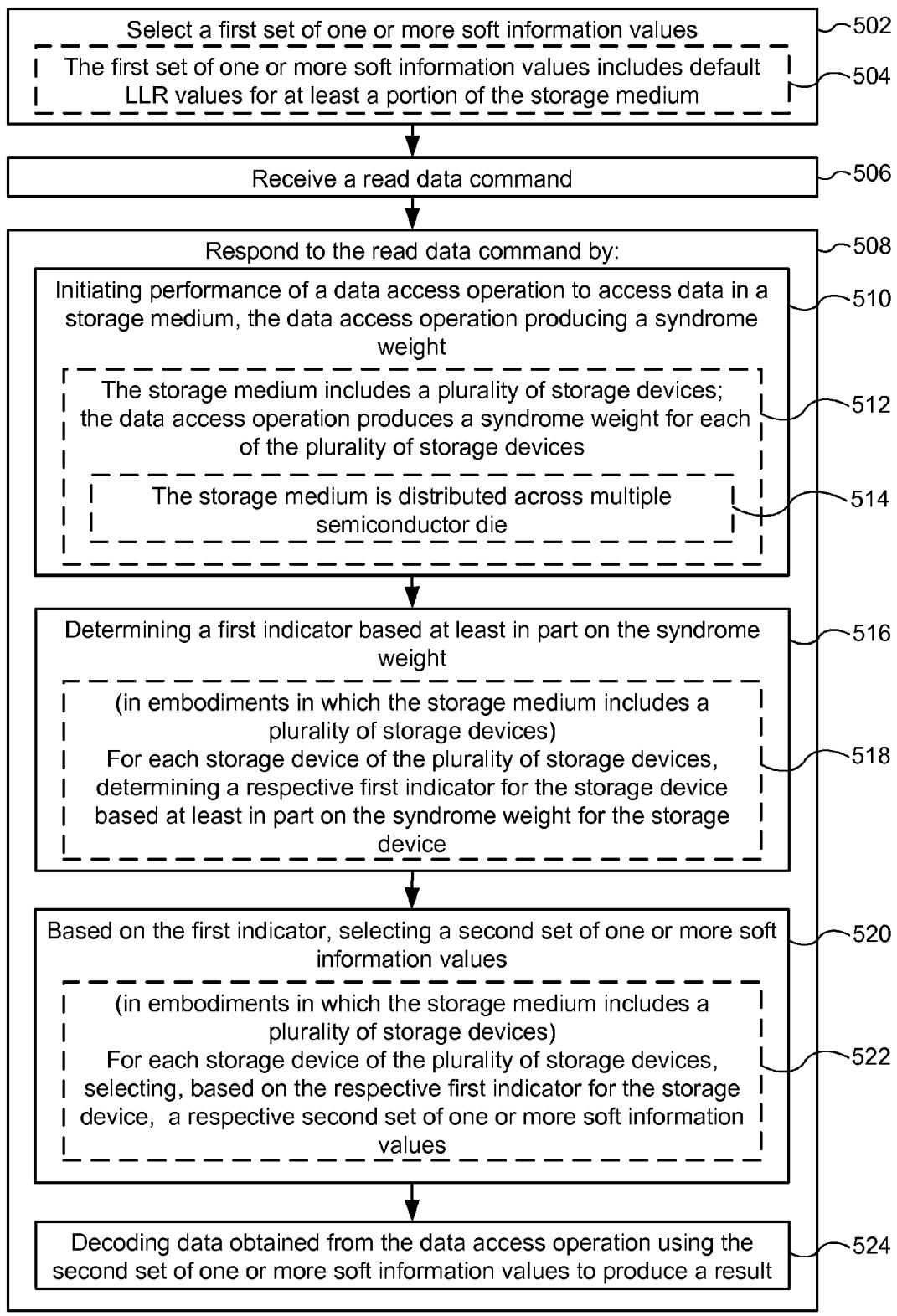
FIG. 5 illustrates a flowchart representation of a method for decoding data, in accordance with some embodiments.
Figure 6:
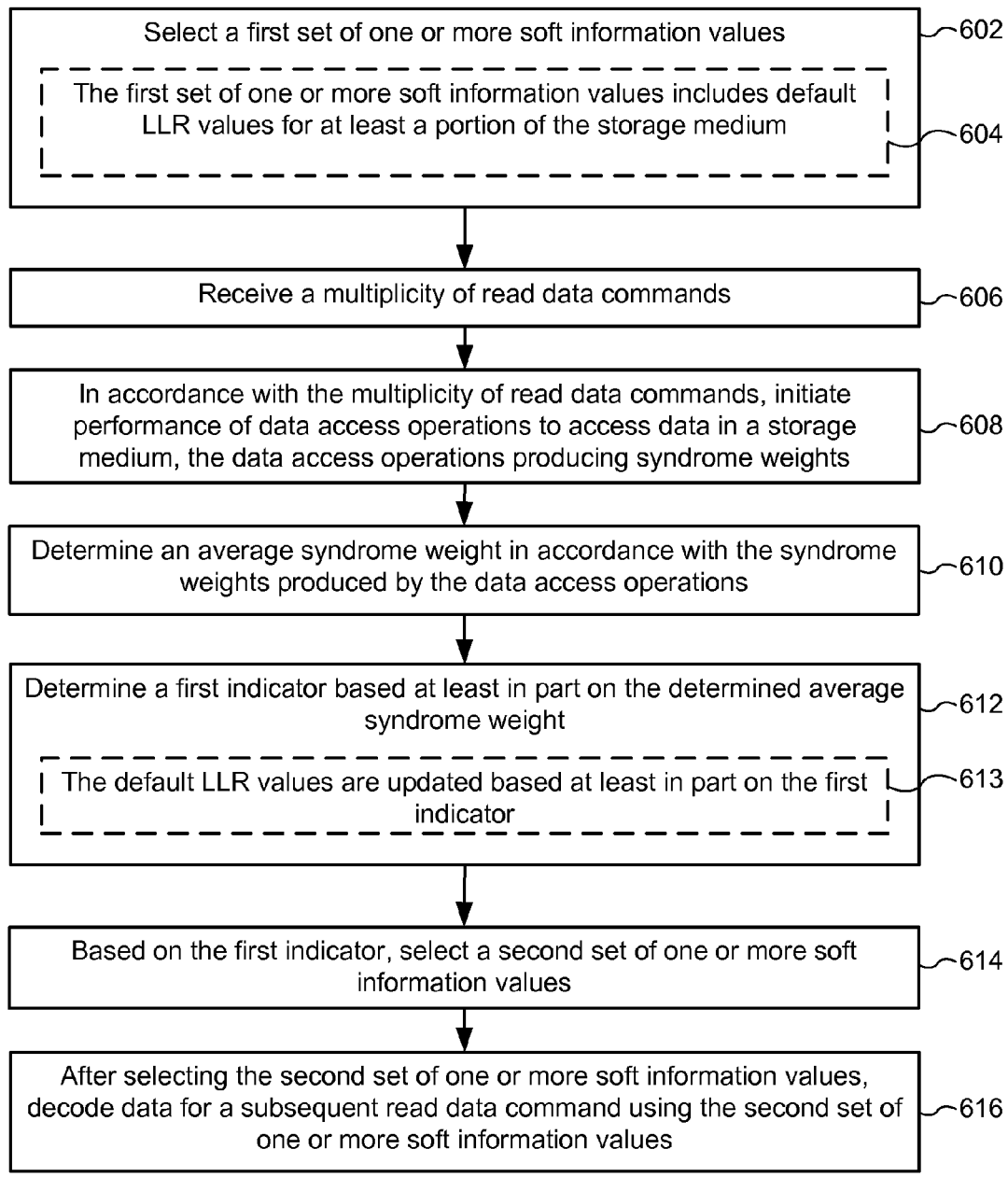
FIG. 6 illustrates a flowchart representation of a method for decoding data, in accordance with some embodiments.
Figure 7A:
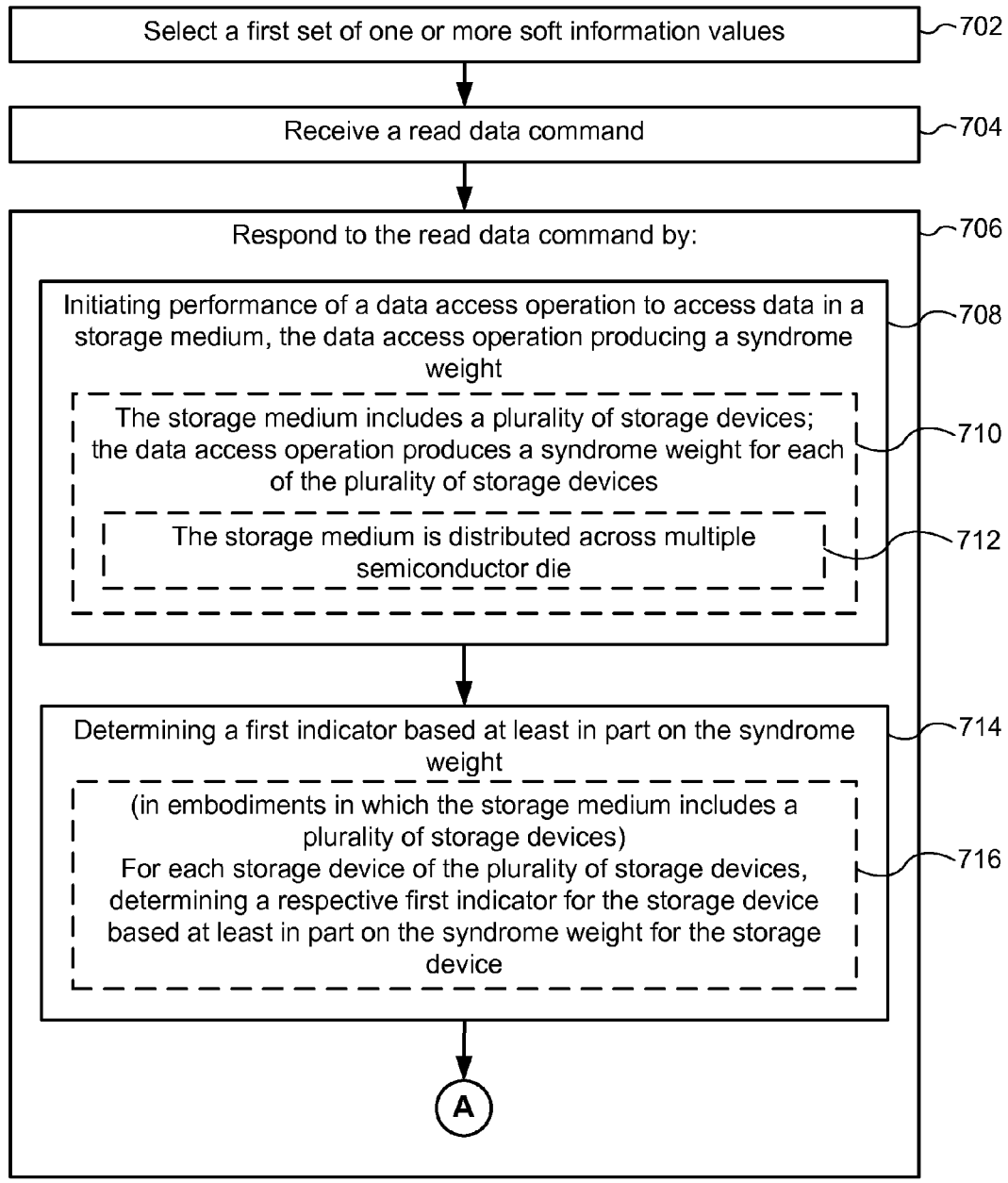
FIGS. 7A-7B illustrate a flowchart representation of a method for decoding data, in accordance with some embodiments.
Figure 7B:
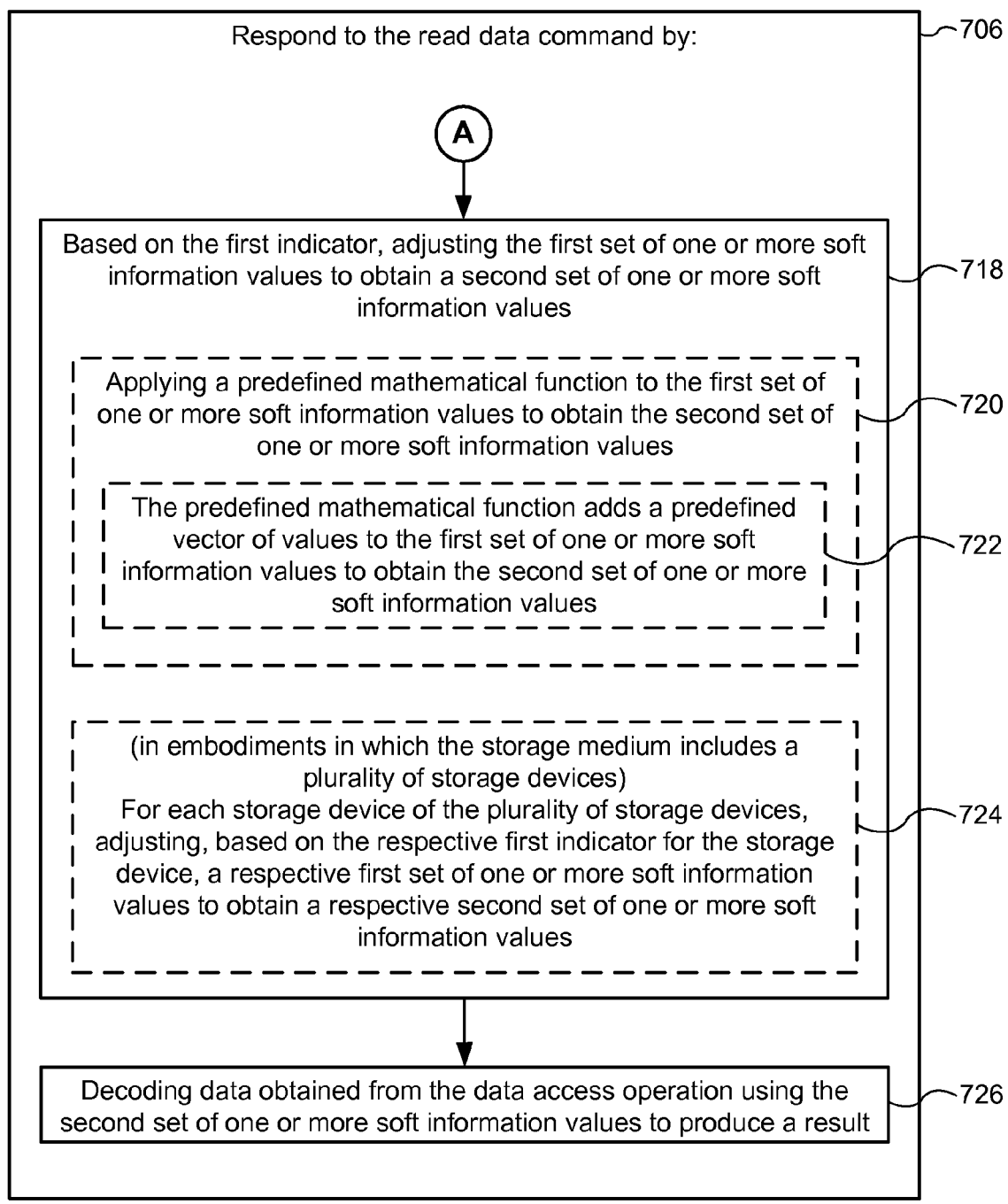

It is noted that methods 500, 600, and 700, represented by FIGS. 5, 6, and 7A-7B, respectively, are methods for decoding data read from a storage medium. Although each of the methods 500, 600, and 700 are methods for decoding data, the method of obtaining a second set of soft information values used to decode data varies between the methods. In FIG. 5, or method 500, the second set of soft information values is based on a syndrome weight for a current read data command. In FIG. 6, or method 600, the second set of soft information values is based on an average syndrome weight for a multiplicity of read data commands. In FIGS. 7A-7B, or method 700, the second set of soft information values is obtained by adjusting a first set of soft information values.

FIG. 5 illustrates a flowchart representation of a method 500 for decoding data read from a storage medium. In some embodiments, method 500 is performed by a memory controller (e.g., memory controller 120, FIG. 1) distinct from and coupled to the storage medium (e.g., storage medium 130, FIG. 1) by one or more connections (e.g., connections 103, FIG. 1), and the data read commands are received from a device distinct from the memory controller (e.g., computer system 110, FIG. 1). As noted above with respect to FIG. 1, a read operation is typically initiated when a computer system (e.g., computer system 110, FIG. 1, sometimes called a host) sends one or more host read commands on control line 111 to memory controller 120 requesting data from storage medium 130. In response, memory controller 120 sends one or more read access commands to storage medium 130, via storage medium I/O 128, which initiates performance of method 500.

At least in some implementations, method 500 is performed by a memory controller (e.g., memory controller 120, FIG. 1) or one or more components of the memory controller (e.g., management module 121, FIGS. 1 and 2A, and/or decoder 127, FIG. 1) to decode data read from a storage medium (e.g., storage medium 130, FIG. 1). In some embodiments, method 500 is governed by instructions that are stored in a non-transitory computer readable storage medium and that are executed by one or more processors of a device, such as the one or more processing units (CPUs) 122 of management module 121, shown in FIGS. 1 and 2A.

A memory controller selects (502) a first set of one or more soft information values. In some embodiments, soft information includes transition probabilities and/or log-likelihood ratios (LLRs). In some embodiments, soft information values are sometimes also known as probabilistic decoder values. In some implementations, soft information values are stored in a look-up table (e.g., soft information table 216, FIG. 2B). In some implementations, soft information values are stored as components of a characterization vector (e.g., LLR values 340 in characterization vector 320, FIG. 3C) associated with the storage medium or a portion of the storage medium.

In some embodiments, the first set of one or more soft information values includes (504) default LLR values (e.g., the default set of LLR values 341, FIG. 3C) for at least a portion of the storage medium (e.g., storage medium 130, FIG. 1). In some implementations, the first set of one or more soft information values is selected based on a specified set of one or more storage medium characterization parameter values (e.g., age (as measured by program erase cycles), temperature, word line zone (e.g., edge, middle, etc.)) for the storage medium.

The memory controller receives (506) a read data command. As explained above, in some embodiments, the memory controller (e.g., memory controller 120, FIG. 1) receives a read data command from a computer system (e.g., computer system 110, FIG. 1, sometimes called a host) on a control line (e.g., control line 111, FIG. 1).

The memory controller responds (508) to the read data command by initiating (510) performance of a data access operation to access data in a storage medium (e.g., storage medium 130, FIG. 1), the data access operation producing a syndrome weight. In some embodiments, the data access operation is primarily performed to obtain data from the storage medium (e.g., storage medium 130, FIG. 1), and secondarily to obtain the syndrome weight. FIG. 1, for example, shows management module 121 (a component of memory controller 120) configured to initiate performance of a data access operation from storage medium 130 via storage medium I/O 128.

In some embodiments, the storage medium includes (512) a plurality of storage devices and the data access operation produces a syndrome weight for each of the plurality of storage devices. As an example, if the storage medium (e.g., storage medium 130, FIG. 1) includes four storage devices, the data access operation produces a syndrome weight for each of the four storage devices, resulting in at least a total of four syndrome weights.

In some embodiments, the storage medium is (514) distributed across multiple semiconductor die. For example, in some implementations, the storage medium (e.g., storage medium 130, FIG. 1) is distributed across multiple Flash memory die.

The memory controller further responds (508) to the read data command by determining (516) a first indicator based at least in part on the syndrome weight. As explained above, a syndrome weight indicates the number of bit errors detected in a given iteration of the decoding process and a syndrome weight of zero indicates decoding was successful and the data has been recovered.

In some embodiments in which the storage medium includes a plurality of storage devices, determining the first indicator includes, for each storage device of the plurality of storage devices, determining (518) a respective first indicator for the storage device based at least in part on the syndrome weight for the storage device. As an example, if the storage medium (e.g., storage medium 130, FIG. 1) includes four storage devices (e.g., devices $X_0$ through $X_3$) with four respective syndrome weights (e.g., syndrome weights $W_0$ through $W_3$), the first indicator is determined for each device X, based at least in part on syndrome weight $W_i$.

The memory controller further responds (508) to the read data command by, based on the first indicator (e.g., based at least in part on the syndrome weight), selecting (520) a second set of one or more soft information values. In some embodiments, if the first indicator falls in one range (e.g., range A), the memory controller selects a particular set of one or more soft information values (e.g., soft information set A 230, FIG. 2B); if the first indicator falls in another range (e.g., range B), the memory controller selects another set of one or more soft information values (e.g., soft information set B 232, FIG. 2B); if the first indicator falls in yet another range (e.g., range C), the memory controller selects yet another set of one or more soft information values (e.g., soft information set C 234, FIG. 2B). Optionally, in some embodiments, for a given characterization vector (e.g., characterization vector 320, FIG. 3C), if the first indicator is determined to be in one range (e.g., range A), a particular set of one or more soft information values (e.g., the set of LLR values for syndrome weight range A 342, FIG. 3C) is selected; if the first indicator is determined to be in another range (e.g., range B), another set of one or more soft information values (e.g., the set of LLR values for syndrome weight range B 343, FIG. 3C) is selected; if the first indicator is determined to be in yet another range (e.g., range C), yet another set of one or more soft information values (e.g., the set of LLR values for syndrome weight range C 344, FIG. 3C) is selected.

In some embodiments in which the storage medium includes a plurality of storage devices, selecting a second set of one or more soft information values includes, for each storage device of the plurality of storage devices, selecting (522), based on the respective first indicator for the storage device, a respective second set of one or more soft information values. Using the example from above, where the storage medium (e.g., storage medium 130, FIG. 1) includes four storage devices (e.g., devices $X_0$ to $X_3$) with four respective syndrome weights (e.g., syndrome weights $W_0$ to $W_3$) and four respective first indicators (e.g., first indicators $I_0$ to $I_3$), if first indicator $I_0$ falls in one range (e.g., range A), the memory controller selects a particular set of one or more soft information values (e.g., soft information set A 230, FIG. 2B) for device $X_0$; if first indicator L falls in another range (e.g., range B), the memory controller selects another set of one or more soft information values (e.g., soft information set B 232, FIG. 2B) for device $X_0$; if first indicator $I_0$ falls in yet another range (e.g., range C), the memory controller selects yet another set of one or more soft information values (e.g., soft information set C 234, FIG. 2B) for device $X_0$. Similarly, in some embodiments, the memory controller selects the appropriate set of one or more soft information values for devices $X_1$ to $X_3$ based on first indicators $I_1$ to $I_3$, respectively. Optionally, in some embodiments, the plurality of storage devices each have a respective characterization vector associated with that portion of the storage medium (e.g., for that particular storage device). In those embodiments, the memory controller selects the appropriate set of one or more soft information values from the LLR values (e.g., LLR values 340, FIG. 3C) stored on the respective characterization vector (e.g., characterization vector 320, FIG. 3C) for the plurality of storage devices in an analogous manner as explained above.

Finally, the memory controller further responds to the read data command by decoding (524) data obtained from the data access operation using the second set of one or more soft information values to produce a result. FIG. 1, for example, shows a decoder (e.g., decoder 127, FIG. 1, a component of memory controller 120) configured to decode data obtained from the data access operation using a second set of one or more soft information values to produce a result.

FIG. 6 illustrates a flowchart representation of a method 600 for decoding data read from a storage medium. In some embodiments, method 600 is performed by a memory controller (e.g., memory controller 120, FIG. 1) distinct from and coupled to the storage medium (e.g., storage medium 130, FIG. 1) by one or more connections (e.g., connections 103, FIG. 1), and the data read commands are received from a device distinct from the memory controller (e.g., computer system 110, FIG. 1). As noted above with respect to FIG. 1, a read operation is typically initiated when a computer system (e.g., computer system 110, FIG. 1, sometimes called a host) sends one or more host read commands on control line 111 to memory controller 120 requesting data from storage medium 130. In response, memory controller 120 sends one or more read access commands to storage medium 130, via storage medium I/O 128, which initiates performance of method 600.

At least in some implementations, method 600 is performed by a memory controller (e.g., memory controller 120, FIG. 1) or one or more components of the memory controller (e.g., management module 121, FIGS. 1 and 2A, and/or decoder 127, FIG. 1) to decode data read from a storage medium (e.g., storage medium 130, FIG. 1). In some embodiments, method 600 is governed by instructions that are stored in a non-transitory computer readable storage medium and that are executed by one or more processors of a device, such as the one or more processing units (CPUs) 122 of management module 121, shown in FIGS. 1 and 2A.

A memory controller selects (602) a first set of one or more soft information values. See the discussion of operation 502 above for further information regarding soft information and the first set of one or more soft information values.

In some embodiments, the first set of one or more soft information values includes (604) default LLR values (e.g., the default set of LLR values 341, FIG. 3C) for at least a portion of the storage medium (e.g., storage medium 130, FIG. 1).

The memory controller receives (606) a multiplicity of read data commands. In some embodiments, the memory controller (e.g., memory controller 120, FIG. 1) receives a multiplicity of read data commands from a computer system (e.g., computer system 110, FIG. 1, sometimes called a host) on a control line (e.g., control line 111, FIG. 1).

In accordance with the multiplicity of read data commands, the memory controller initiates (608) performance of data access operations to access data in a storage medium (e.g., storage medium 130, FIG. 1), the data access operations producing syndrome weights. In some embodiments, the data access operations are primarily performed to obtain data from the storage medium (e.g., storage medium 130, FIG. 1), and secondarily to obtain syndrome weights. FIG. 1, for example, shows management module 121 (a component of memory controller 120) configured to initiate performance of data access operations from storage medium 130 via storage medium I/O 128.

The memory controller determines (610) an average syndrome weight in accordance with the syndrome weights produced by the data access operations. For example, in some embodiments, if the memory controller receives ten read data commands, initiates performance of N (e.g., 10, 100, or 1000) data access operations, which produce N syndrome weights, the memory controller determines an average syndrome weight in accordance with the N syndrome weights produced by the N data access operations.

Next, the memory controller determines (612) a first indicator based at least in part on the determined average syndrome weight. As explained above, a syndrome weight indicates the number of bit errors detected in a given iteration of the decoding process and a syndrome weight of zero indicates decoding was successful and the data has been recovered. Furthermore, in some embodiments, default LLR values (e.g., the default set of LLR values 341, FIG. 3C) are updated (613) based at least in part on the first indicator.

Based on the first indicator (e.g., based at least in part on the determined average syndrome weight), the memory controller selects (614) a second set of one or more soft information values. In some embodiments, if the first indicator falls in one range (e.g., range A), the memory controller selects a particular set of one or more soft information values (e.g., soft information set A 230, FIG. 2B); if the first indicator falls in another range (e.g., range B), the memory controller selects another set of one or more soft information values (e.g., soft information set B 232, FIG. 2B); if the first indicator falls in yet another range (e.g., range C), the memory controller selects yet another set of one or more soft information values (e.g., soft information set C 234, FIG. 2B). Optionally, in some embodiments, for a given characterization vector (e.g., characterization vector 320, FIG. 3C), if the first indicator is determined to be in one range (e.g., range A), a particular set of one or more soft information values (e.g., the set of LLR values for syndrome weight range A 342, FIG. 3C) is selected; if the first indicator is determined to be in another range (e.g., range B), another set of one or more soft information values (e.g., the set of LLR values for syndrome weight range B 343, FIG. 3C) is selected; if the first indicator is determined to be in yet another range (e.g., range C), yet another set of one or more soft information values (e.g., the set of LLR values for syndrome weight range C 344, FIG. 3C) is selected.

Finally, after selecting the second set of one or more soft information values, the memory controller decodes (616) data for a subsequent read data command using the second set of one or more soft information values. FIG. 1, for example, shows a decoder (e.g., decoder 127, FIG. 1, a component of memory controller 120) configured to decode data for a subsequent read data command using the second set of one or more soft information values. Using the example from above (where the memory controller receives N read data commands and selects a second set of one or more soft information values based on the first indicator, which is based at least in part on the determined average syndrome weight), the memory controller decodes data for an N+1th read data command using the selected second set of one or more soft information values.

FIGS. 7A-7B illustrate a flowchart representation of a method 700 for decoding data read from a storage medium. In some embodiments, method 700 is performed by a memory controller (e.g., memory controller 120, FIG. 1) distinct from and coupled to the storage medium (e.g., storage medium 130, FIG. 1) by one or more connections (e.g., connections 103, FIG. 1), and the data read commands are received from a device distinct from the memory controller (e.g., computer system 110, FIG. 1). As noted above with respect to FIG. 1, a read operation is typically initiated when a computer system (e.g., computer system 110, FIG. 1, sometimes called a host) sends one or more host read commands on control line 111 to memory controller 120 requesting data from storage medium 130. In response, memory controller 120 sends one or more read access commands to storage medium 130, via storage medium I/O 128, which initiates performance of method 700.

At least in some implementations, method 700 is performed by a memory controller (e.g., memory controller 120, FIG. 1) or one or more components of the memory controller (e.g., management module 121, FIGS. 1 and 2A, and/or decoder 127, FIG. 1) to decode data read from a storage medium (e.g., storage medium 130, FIG. 1). In some embodiments, method 700 is governed by instructions that are stored in a non-transitory computer readable storage medium and that are executed by one or more processors of a device, such as the one or more processing units (CPUs) 122 of management module 121, shown in FIGS. 1 and 2A.

A memory controller selects (702) a first set of one or more soft information values. See the discussion of operation 502 above for further information regarding soft information and the first set of one or more soft information values.

The memory controller receives (704) a read data command. As explained above, in some embodiments, the memory controller (e.g., memory controller 120, FIG. 1) receives a read data command from a computer system (e.g., computer system 110, FIG. 1, sometimes called a host) on a control line (e.g., control line 111, FIG. 1).

The memory controller responds (706) to the read data command by initiating (708) performance of a data access operation to access data in a storage medium (e.g., storage medium 130, FIG. 1), the data access operation producing a syndrome weight. In some embodiments, the data access operation is primarily performed to obtain data from the storage medium (e.g., storage medium 130, FIG. 1), and secondarily to obtain the syndrome weight. FIG. 1, for example, shows management module 121 (a component of memory controller 120) configured to initiate performance of a data access operation from storage medium 130 via storage medium I/O 128.

In some embodiments, the storage medium includes (710) a plurality of storage devices and the data access operation produces a syndrome weight for each of the plurality of storage devices. As an example, if the storage medium (e.g., storage medium 130, FIG. 1) includes four storage devices, the data access operation produces a syndrome weight for each of the four storage devices, resulting in at least four syndrome weights.

In some embodiments, the storage medium is (712) distributed across multiple semiconductor die. For example, in some implementations, the storage medium (e.g., storage medium 130, FIG. 1) is distributed across multiple Flash memory die.

The memory controller further responds to the read data command by determining (714) a first indicator based at least in part on the syndrome weight. As explained above, a syndrome weight indicates the number of bit errors detected in a given iteration of the decoding process and a syndrome weight of zero indicates decoding was successful and the data has been recovered.

In some embodiments in which the storage medium includes a plurality of storage devices, determining the first indicator includes, for each storage device of the plurality of storage devices, determining (716) a respective first indicator for the storage device based at least in part on the syndrome weight for the storage device. As an example, if the storage medium (e.g., storage medium 130, FIG. 1) includes four storage devices (e.g., devices $X_0$ through $X_3$) with four respective syndrome weights (e.g., syndrome weights $W_0$ through $W_3$), the first indicator is determined for each device $X_i$ based at least in part on syndrome weight $W_i$.

The memory controller further responds to the read data command by, based on the first indicator (e.g., based at least in part on the syndrome weight), adjusting (718) the first set of one or more soft information values to obtain a second set of one or more soft information values. In some embodiments, adjusting the first set of one or more soft information values includes applying (720) a predefined mathematical function to the first set of one or more soft information values to obtain the second set of one or more soft information values. For example, in some implementations, a predefined mathematical function includes addition. As another example, in some implementations, a predefined mathematical function includes subtraction. As yet another example, in some implementations, a predefined mathematical function includes multiplication. In still other examples, in some implementations, a predefined mathematical function includes any number of mathematical functions. In some embodiments, the magnitude and/or manner of adjustment to the first set of one or more soft information values is based on the first indicator, which is based at least in part on the syndrome weight.

In some embodiments, the predefined mathematical function adds (722) a predefined vector of values to the first set of one or more soft information values to obtain the second set of one or more soft information values. For example, if the first indicator is in one range (e.g., range A), and given a first set of one or more soft information values (e.g., [−7, −2, +2, +7]), the predefined mathematical function adds a predefined vector of values (e.g., [+1, +1, −1, −1]) to the first set of one or more soft information values to obtain a second set of one or more soft information values (e.g., [−6, −1, +1, +6]). As another example, if the first indicator is in another range (e.g., range B), and given a first set of one or more soft information values (e.g., [−7, −2, +2, +7]), the predefined mathematical function adds a predefined vector of values (e.g., [+4, +2, −2, −4]) to the first set of one or more soft information values to obtain a second set of one or more soft information values (e.g., [−3, 0, 0, +3]). In some embodiments, adding a predefined vector of values includes the function of subtracting, since the vector of values can include negative numbers.

In some embodiments in which the storage medium includes a plurality of storage devices, adjusting the first set of one or more soft information values to obtain a second set of one or more soft information values includes, for each storage device of the plurality of storage devices, adjusting (724), based on the respective first indicator for the storage device, a respective first set of one or more soft information values to obtain a respective second set of one or more soft information values. Using the example from above, where the storage medium (e.g., storage medium 130, FIG. 1) includes four storage devices (e.g., devices $X_0$ to $X_3$) with four respective syndrome weights (e.g., syndrome weights $W_0$ to $W_3$) and four respective first indicators (e.g., first indicators $I_0$ to $I_3$), if first indicator $I_0$ falls in one range (e.g., range A), the memory controller adjusts the first set of one or more soft information values for device $X_0$ in one way; if first indicator $I_0$ is in another range (e.g., range B), the memory controller adjusts the first set of one or more soft information values for device $X_0$ in another way. Similarly, in some embodiments, the memory controller adjusts the appropriate set of one or more soft information values for devices $X_1$ to $X_3$ based on first indicators $I_1$ to $I_3$, respectively.

Finally, the memory controller further responds to the read data command by decoding (726) data obtained from the data access operation using the second set of one or more soft information values to produce a result. FIG. 1, for example, shows a decoder (e.g., decoder 127, FIG. 1, a component of memory controller 120) configured to decode data obtained from the data access operation using a second set of one or more soft information values to produce a result.

In some implementations, with respect to any of the methods described above, the storage medium (e.g., storage medium 130, FIG. 1) is a single flash memory device, while in other implementations, the storage medium (e.g., storage medium 130, FIG. 1) includes a plurality of flash memory devices.

In some implementations, with respect to any of the methods described above, a device operable to decode data includes a storage medium interface (e.g., storage medium I/O 128, FIG. 1) for coupling the device to the storage medium (e.g., storage medium 130, FIG. 1) and one or more modules, including a memory management module (e.g., management module 121, FIGS. 1 and 2A) that includes one or more processors (e.g., CPUs 122, FIGS. 1 and 2A) and memory (e.g., memory 206, FIG. 2A) storing one or more programs configured for execution by the one or more processors, the one or more modules coupled to the storage medium interface (e.g., storage medium I/O 128, FIG. 1) and configured to perform or control performance of any of the methods described above.

It will be understood that, although the terms "first," "second," etc. may be used herein to describe various elements, these elements should not be limited by these terms. These terms are only used to distinguish one element from another. For example, a first contact could be termed a second contact, and, similarly, a second contact could be termed a first contact, which changing the meaning of the description, so long as all occurrences of the "first contact" are renamed consistently and all occurrences of the second contact are renamed consistently. The first contact and the second contact are both contacts, but they are not the same contact.

The terminology used herein is for the purpose of describing particular embodiments only and is not intended to be limiting of the claims. As used in the description of the embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific implementations. However, the illustrative discussions above are not intended to be exhaustive or to limit the claims to the precise forms disclosed. Many modifications and variations are possible in view of the above teachings. The implementations were chosen and described in order to best explain principles of operation and practical applications, to thereby enable others skilled in the art.

What is claimed is:

1. A method of decoding data, the method comprising:
selecting a first set of one or more soft information values;
receiving a read data command; and
responding to the read data command by:
   initiating performance of a data access operation to access data in a storage medium, the data access operation producing a syndrome weight;
   determining a first indicator based at least in part on the syndrome weight;
   based on the first indicator, selecting a second set of one or more soft information values; and
   decoding data obtained from the data access operation using the second set of one or more soft information values to produce a result.

2. The method of claim 1, wherein the first set of one or more soft information values includes default LLR values for at least a portion of the storage medium.

3. The method of claim 1, wherein:
the storage medium includes a plurality of storage devices;
the data access operation produces a syndrome weight for each of the plurality of storage devices;
determining the first indicator comprises, for each storage device of the plurality of storage devices, determining a respective first indicator for the storage device based at least in part on the syndrome weight for the storage device; and
selecting a second set of one or more soft information values comprises, for each storage device of the plurality of storage devices, selecting, based on the respective first indicator for the storage device, a respective second set of one or more soft information values.

4. The method of claim 3, wherein the storage medium is distributed across multiple semiconductor die.

5. The method of claim 1, wherein the method is performed by a memory controller distinct from and coupled to the storage medium by one or more connections, and the data read commands are received from a device distinct from the memory controller.

6. A method of decoding data, the method comprising:
selecting a first set of one or more soft information values;
receiving a multiplicity of read data commands;
in accordance with the multiplicity of read data commands, initiating performance of data access operations to access data in a storage medium, the data access operations producing syndrome weights;
determining an average syndrome weight in accordance with the syndrome weights produced by the data access operations;
determining a first indicator based at least in part on the determined average syndrome weight;
based on the first indicator, selecting a second set of one or more soft information values; and
after selecting the second set of one or more soft information values, decoding data for a subsequent read data command using the second set of one or more soft information values.

7. The method of claim 6, wherein the first set of one or more soft information values includes default LLR values for at least a portion of the storage medium, and the default LLR values are updated based at least in part on the first indicator.

8. A method of decoding data, the method comprising:
selecting a first set of one or more soft information values;
receiving a read data command; and
responding to the read data command by:
   initiating performance of a data access operation to access data in a storage medium, the data access operation producing a syndrome weight;
   determining a first indicator based at least in part on the syndrome weight;
   based on the first indicator, adjusting the first set of one or more soft information values to obtain a second set of one or more soft information values; and
   decoding data obtained from the data access operation using the second set of one or more soft information values to produce a result.

9. The method of claim 8, wherein adjusting the first set of one or more soft information values comprises applying a predefined mathematical function to the first set of one or more soft information values to obtain the second set of one or more soft information values.

10. The method of claim 9, wherein the predefined mathematical function adds a predefined vector of values to the first set of one or more soft information values to obtain the second set of one or more soft information values.

11. The method of claim 8, wherein:
the storage medium includes a plurality of storage devices;
the data access operation produces a syndrome weight for each of the plurality of storage devices;
determining the first indicator comprises, for each storage device of the plurality of storage devices, determining a respective first indicator for the storage device based at least in part on the syndrome weight for the storage device; and
adjusting the first set of one or more soft information values to obtain a second set of one or more soft information values comprises, for each storage device of the plurality of storage devices, adjusting, based on the respective first indicator for the storage device, a respective first set of one or more soft information values to obtain a respective second set of one or more soft information values.

12. The method of claim 11, wherein the storage medium is distributed across multiple semiconductor die.

13. A device operable to decode data, comprising:
a storage medium interface for coupling the device to the storage medium; and
one or more modules, including a memory management module that includes one or more processors and memory storing one or more programs configured for execution by the one or more processors, the one or more modules coupled to the storage medium interface and configured to:
   select a first set of one or more soft information values;
   receive a read data command; and
   respond to the read data command by:
      initiating performance of a data access operation to access data in the storage medium, the data access operation producing a syndrome weight;
      determining a first indicator based at least in part on the syndrome weight;
      based on the first indicator, selecting a second set of one or more soft information values; and
      decoding data obtained from the data access operation using the second set of one or more soft information values to produce a result.

14. The device of claim 13, wherein the first set of one or more soft information values includes default LLR values for at least a portion of the storage medium.

15. The device of claim 13, wherein:
the storage medium includes a plurality of storage devices;
the data access operation produces a syndrome weight for each of the plurality of storage devices;
determining the first indicator comprises, for each storage device of the plurality of storage devices, determining a respective first indicator for the storage device based at least in part on the syndrome weight for the storage device; and
selecting a second set of one or more soft information values comprises, for each storage device of the plurality of storage devices, selecting, based on the respective first indicator for the storage device, a respective second set of one or more soft information values.

16. The device of claim 15, wherein the storage medium is distributed across multiple semiconductor die.

17. A device operable to decode data, comprising:
a storage medium interface for coupling the device to the storage medium; and
one or more modules, including a memory management module that includes one or more processors and memory storing one or more programs configured for execution by the one or more processors, the one or more modules coupled to the storage medium interface and configured to:
select a first set of one or more soft information values;
receive a multiplicity of read data commands;
in accordance with the multiplicity of read data commands, initiate performance of data access operations to access data in the storage medium, the data access operations producing syndrome weights;
determine an average syndrome weight in accordance with the syndrome weights produced by the data access operations;
determine a first indicator based at least in part on the determined average syndrome weight;
based on the first indicator, select a second set of one or more soft information values; and
after selecting the second set of one or more soft information values, decode data for a subsequent read data command using the second set of one or more soft information values.

18. The device of claim 17, wherein the first set of one or more soft information values includes default LLR values for at least a portion of the storage medium, and the default LLR values are updated based at least in part on the first indicator.

19. A device operable to decode data, comprising:
a storage medium interface for coupling the device to the storage medium; and
one or more modules, including a memory management module that includes one or more processors and memory storing one or more programs configured for execution by the one or more processors, the one or more modules coupled to the storage medium interface and configured to:
select a first set of one or more soft information values;
receive a read data command; and
respond to the read data command by:
initiating performance of a data access operation to access data in the storage medium, the data access operation producing a syndrome weight;
determining a first indicator based at least in part on the syndrome weight;
based on the first indicator, adjusting the first set of one or more soft information values to obtain a second set of one or more soft information values; and
decoding data obtained from the data access operation using the second set of one or more soft information values to produce a result.

20. The device of claim 19, wherein adjusting the first set of one or more soft information values comprises applying a predefined mathematical function to the first set of one or more soft information values to obtain the second set of one or more soft information values.

21. The device of claim 20, wherein the predefined mathematical function adds a predefined vector of values to the first set of one or more soft information values to obtain the second set of one or more soft information values.

22. The device of claim 19, wherein:
the storage medium includes a plurality of storage devices;
the data access operation produces a syndrome weight for each of the plurality of storage devices;
determining the first indicator comprises, for each storage device of the plurality of storage devices, determining a respective first indicator for the storage device based at least in part on the syndrome weight for the storage device; and
adjusting the first set of one or more soft information values to obtain a second set of one or more soft information values comprises, for each storage device of the plurality of storage devices, adjusting, based on the respective first indicator for the storage device, a respective first set of one or more soft information values to obtain a respective second set of one or more soft information values.

23. The device of claim 22, wherein the storage medium is distributed across multiple semiconductor die.

* * * * *